US012603333B2

(12) United States Patent
Sun

(10) Patent No.: US 12,603,333 B2
(45) Date of Patent: Apr. 14, 2026

(54) CIRCUIT STRUCTURE, BATTERY, AND ELECTRONIC DEVICE

(71) Applicant: GUANGDONG OPPO MOBILE TELECOMMUNICATIONS CORP., LTD., Dongguan (CN)

(72) Inventor: Guozhen Sun, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 754 days.

(21) Appl. No.: 18/092,210

(22) Filed: Dec. 31, 2022

(65) Prior Publication Data

US 2023/0187714 A1     Jun. 15, 2023

Related U.S. Application Data

(63) Continuation of application No. PCT/CN2021/112191, filed on Aug. 12, 2021.

(30) Foreign Application Priority Data

| Sep. 11, 2020 | (CN) | 202010955441.2 |
| Sep. 30, 2020 | (CN) | 202022223615.4 |
| Oct. 18, 2020 | (CN) | 202011114033.0 |

(51) Int. Cl.
*H01M 10/42*          (2006.01)
*H01M 50/284*       (2021.01)
                (Continued)

(52) U.S. Cl.
CPC ..... *H01M 10/4257* (2013.01); *H01M 50/284* (2021.01); *H05K 9/0071* (2013.01); *H05K 1/181* (2013.01); *H05K 2201/1003* (2013.01)

(58) Field of Classification Search
CPC .............. H01M 50/284; H01M 10/48; H01M 10/4257; H05K 9/0071
See application file for complete search history.

(56) References Cited

U.S. PATENT DOCUMENTS

| 2011/0262779 A1 | 10/2011 | Maleki et al. |
| 2013/0057288 A1 | 3/2013 | Ogata et al. |

FOREIGN PATENT DOCUMENTS

| CN | 1214163 A | 4/1999 |
| CN | 1427550 A | 7/2003 |
| | (Continued) | |

OTHER PUBLICATIONS

Chinese First Office Action for Chinese Patent Application No. 202011114033.0, mailed Apr. 15, 2024, 24 pages.
(Continued)

*Primary Examiner* — Sarah A. Slifka
(74) *Attorney, Agent, or Firm* — Young Basile Hanlon & MacFarlane, P.C.

(57)          ABSTRACT

Provided are a circuit structure, a battery, and an electronic device. The circuit structure comprises: a battery, comprising a first positive electrode, a first negative electrode, and a battery cell, wherein the battery cell is connected between the first positive electrode and the first negative electrode, and the battery cell is configured to generate a first induced magnetic field when a changing current flows therethrough; and an electromagnetic inductor, configured to generate a second induced magnetic field when the changing current flows therethrough, wherein the second induced magnetic field is superposed on the first induced magnetic field.

20 Claims, 16 Drawing Sheets

200

(51) Int. Cl.
   *H05K 1/181*   (2026.01)
   *H05K 9/00*    (2006.01)

(56)              References Cited

FOREIGN PATENT DOCUMENTS

| | | | |
|---|---|---|---|
| CN | 1127821   | C | 11/2003 |
| CN | 102074725 | A | 5/2011 |
| CN | 102544594 | A | 7/2012 |
| CN | 102612868 | A | 7/2012 |
| CN | 103003980 | A | 3/2013 |
| CN | 109379839 | A | 2/2019 |
| CN | 209659358 | U | 11/2019 |
| CN | 213150851 | U | 5/2021 |
| CN | 213343218 | U | 6/2021 |
| EP | 3301903   | A2 | 4/2018 |

OTHER PUBLICATIONS

European Search Report for European Patent Application No. 21865788.0, mailed Jul. 1, 2024, 62 pages.

International Search Report and Written Opinion with English Translation for PCT Application PCT/CN2021/112191 mailed Nov. 15, 2021. (15 pages).

Chinese First Office Action with English Translation for CN Application 202022223615.4, mailed Jun. 7, 2021 (7 pages).

International Search Report and Written Opinion with English translation, for International Application No. PCT/CN2021/112337, mailed Nov. 11, 2021, 20 pages.

Chinese Second Office Action for Chinese Patent Application No. 202011114033.0, mailed Nov. 22, 2024, 25 pages.

200

<u>200</u>

20

20

220

220

220

220

242

210

246

220

242

2494

2492

2262

2264

226

220

268
210
221
266
226

220

268
266
210
2262
2214
221
2212
2264
226

<u>10</u>

<u>10</u>

CIRCUIT STRUCTURE, BATTERY, AND ELECTRONIC DEVICE

CROSS-REFERENCE TO RELATED APPLICATION(S)

The present application is a continuation of International (PCT) Patent Application No. PCT/CN2021/112191 filed on Aug. 12, 2021, and claims the priorities of Chinese patent application No. 202010955441.2, filed on Sep. 11, 2020; Chinese patent application No. 202022223615.4, filed on Sep. 30, 2020; and Chinese patent application No. 202011114033.0, filed on Oct. 18, 2020, the entire contents of all of which are incorporated herein by reference.

TECHNICAL FIELD

The present disclosure relates to a field of electronic technologies, in particular to a circuit structure, a battery, an electronic device and a battery manufacturing method.

BACKGROUND

In an electronic device, when a current of the battery changes, the battery will generate an induced magnetic field due to an internal structure thereof and the changed current, thereby generating an electromagnetic radiation. The electromagnetic radiation generated by the battery will affect surrounding devices.

SUMMARY

An embodiment of the present disclosure provides a circuit structure including: a battery, the battery includes a first positive electrode, a first negative electrode and a battery cell, the battery cell is connected between the first positive electrode and the first negative electrode, and the battery cell is configured to generate a first induced magnetic field when a changing current flows therethrough; and an electromagnetic inductor, the electromagnetic inductor is configured to generate a second induced magnetic field when the a changing current flows therethrough, and the second induced magnetic field is superimposed on the first induced magnetic field.

An embodiment of the present disclosure provides a battery, including: a first positive electrode, a first negative electrode, and a battery cell, the battery cell is connected between the first positive electrode and the first negative electrode, and the battery cell is configured to generate a first induced magnetic field when a changing current flows therethrough; and an electromagnetic inductor, the electromagnetic inductor is configured to generate a second induced magnetic field when the changing current flows therethrough, and the second induced magnetic field is superimposed on the first induced magnetic field.

An embodiment of the present disclosure also provides an electronic device, including a load and a circuit structure or a battery, the circuit structure or the battery is connected to the load and supplies a power to the load, the circuit structure or the battery includes a first positive electrode, a first negative electrode, a battery cell and an electromagnetic inductor; the battery cell is connected between the first positive electrode and the first negative electrode, the battery cell is configured to generate a first induced magnetic field when a changing current flows therethrough, the electromagnetic inductor is configured to generate a second induced magnetic field when the changing current flows therethrough, and the second induced magnetic field is superimposed on the first induced magnetic field.

BRIEF DESCRIPTION OF DRAWINGS

In order to more clearly illustrate technical solutions in embodiments of the present disclosure, drawings that need to be used in a description of the embodiments will be briefly introduced below.

DETAILED DESCRIPTION

The technical solutions in the embodiments of the present disclosure will be clearly and completely described below in conjunction with the drawings in the embodiments of the present disclosure. Apparently, the described embodiments are only some of the embodiments of the present disclosure, not all of them. Based on the embodiments in the present disclosure, all other embodiments obtained by those skilled in the art without making creative efforts belong to the protection scope of the present disclosure.

Figure 1:
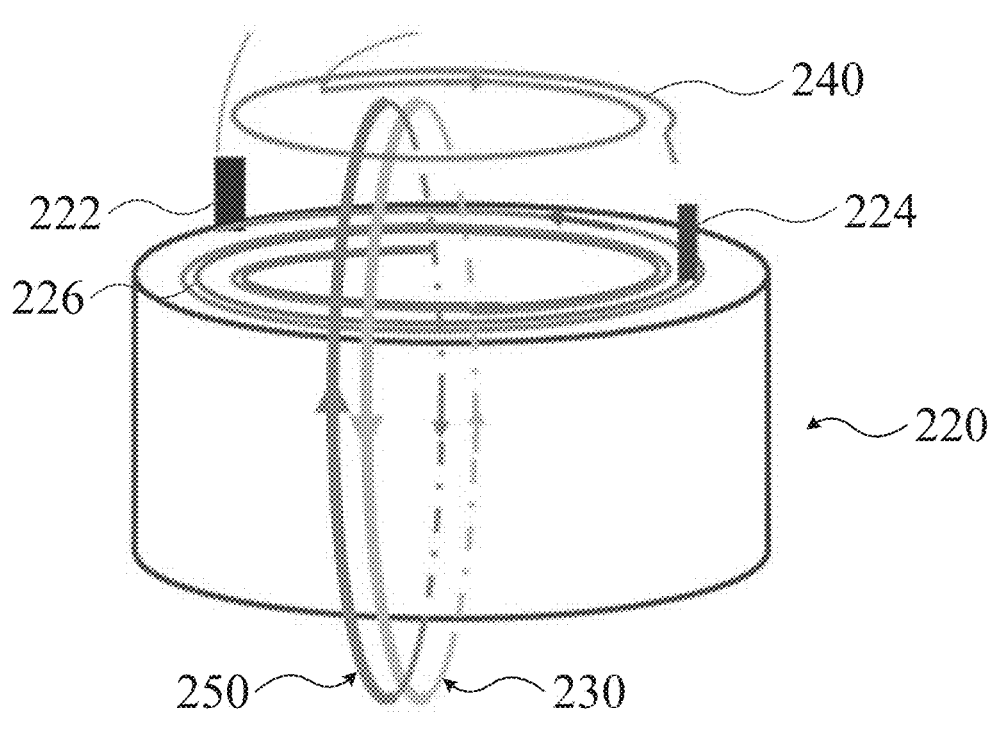
FIG. 1 is a schematic diagram of a first structure of a circuit structure provided by some embodiments of the present disclosure.

A circuit structure is provided according to some embodiments of the present disclosure. As shown in FIG. 1, FIG. 1 is a schematic diagram of a first structure of the circuit structure provided by one embodiment of the present disclosure. The circuit structure 200 includes a battery 220 and an electromagnetic inductor 240. The battery 220 includes a first positive electrode 222, a first negative electrode 224 and a battery cell 226. The battery cell 226 is connected between the first positive electrode 222 and the first negative electrode 224. The battery cell 226 can supply a power to a load through the first positive electrode 222 and the first negative electrode 224. The battery cell 226 can generate a first induced magnetic field 230 when a changing current flows therethrough.

It should be appreciated that, the battery cell 226 can supply the power to the load, such as powering an acoustic-electric device, a processor, or the like. Because a power of the acoustic-electric device or the processor is different at different times, that is, the acoustic-electric device or the processor is an alternating load, a current in the acoustic-electric device or the processor changes, and a current in the battery cell 226 also changes with the current in the acoustic-electric device or the processor, so that the battery cell 226 generates a changing first induced magnetic field. The first induced magnetic field will affect surrounding devices. For example, the acoustic-electric device may generate noise due to the first induced magnetic field.

The electromagnetic inductor 240 is configured to generate a second induced magnetic field 250 when the changing current flows therethrough. The second induced magnetic field 250 can be superimposed on the first induced magnetic field 230. A superimposed induced magnetic field meets requirements of the surrounding devices and different scenarios.

After the second induced magnetic field 250 is superimposed on the first induced magnetic field 230, a magnetic field intensity of the first induced magnetic field 230 is weakened, that is, the second induced magnetic field 250 can cancel part or all of the first induced magnetic field 230. The first induced magnetic field 230 and the second induced magnetic field 250 are superimposed to form a total induced magnetic field of the circuit structure 200. A magnetic field intensity of the total induced magnetic field is smaller than the magnetic field intensity of the first induced magnetic field 230, so that an influence on the surrounding devices can be weakened. There is no need to arrange a complicated anti-magnetic field interference structure around the battery 220, which reduces the cost. By adding the electromagnetic inductor 240, a magnetic field radiation of the battery cell 226 can be effectively and significantly cancelled, the design is ingenious and effective, and an improvement effect on a magnetic field interference is stable and reliable.

For example, when the surrounding device is the electro-acoustic device, the electro-acoustic device is interfered by the first induced magnetic field to generate noise. After the second induced magnetic field is superimposed on the first induced magnetic field, the electro-acoustic device is affected by the total induced magnetic field, that is, affected by the second induced magnetic field and the first induced magnetic field superimposed with each other. Accordingly, the electro-acoustic device does not generate noise or generates very little noise.

Figure 2:
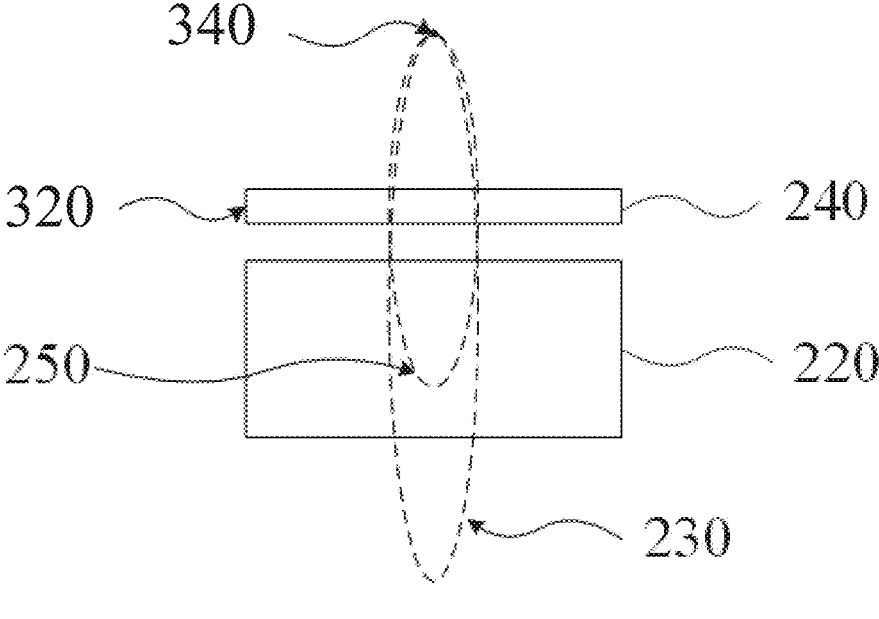
FIG. 2 is a schematic diagram of a second structure of the circuit structure provided by some embodiments of the present disclosure.

It should be appreciated that, a magnetic field direction and a magnetic field intensity of the second induction magnetic field 250 of the electromagnetic inductor 240 are hardly identical to a magnetic field direction and the magnetic field intensity of the first induced magnetic field 230. In order to reduce an effect on part of the surrounding devices, the electromagnetic inductor 240 can be reasonably arranged, so that the magnetic field intensity of the first induced magnetic field 230 is weakened at a position of the surrounding devices. As shown in FIG. 2, FIG. 2 is a schematic diagram of a second structure of the circuit structure provided by some embodiments of the present disclosure. The electromagnetic inductor 240 can be disposed at a first position 320 in the first induced magnetic field 230, so that the magnetic field intensity at a second position 340 in the first induced magnetic field 230 is weakened after the second induction magnetic field 250 is superimposed on the first induction magnetic field 230.

The electromagnetic inductor 240 can be disposed on the first position 320 first, and then the second position 340 where the first induced magnetic field 230 is weakened by the second induced magnetic field 250 can be calculated, and the surrounding devices can be disposed on the second position 340, the magnetic field intensity at a position of the surrounding devices disposed on the second position 340 is relatively small, that is, the magnetic field intensity that interferes surrounding devices is small, which weakens an interference to the surrounding devices. It is also possible to dispose the surrounding devices on the second position 340 first, and then calculate a required second induced magnetic field 250 according to the magnetic field intensity that needs to be weakened at the second position 340 in the first induced magnetic field 230, and then select a suitable electromagnetic inductor 240 and place the suitable electromagnetic inductor 240 in a suitable position to achieve the above requirements.

It should be appreciated that, when the surrounding devices requires a larger magnetic field intensity, after the second induced magnetic field is superimposed on the first induced magnetic field, the magnetic field intensity of the first induced magnetic field is enhanced. It can also be appreciated that, the total induced magnetic field of the circuit structure is formed after the first induced magnetic field and the second induced magnetic field are superimposed, and the magnetic field intensity of the total induced magnetic field is stronger than the magnetic field intensity of the first induced magnetic field, so that the influence on the surrounding devices can be enhanced.

For example, when the surrounding device is a preset magnetic induction device, the preset magnetic induction device can receive the first induced magnetic field and convert it into electrical energy. After the second induced magnetic field is superimposed on the first induced magnetic field, the preset magnetic induction device is affected by the total induced magnetic field, that is, affected by the second induced magnetic field and first induced magnetic field superimposed with each other, and can convert more electric energy.

Figure 3:
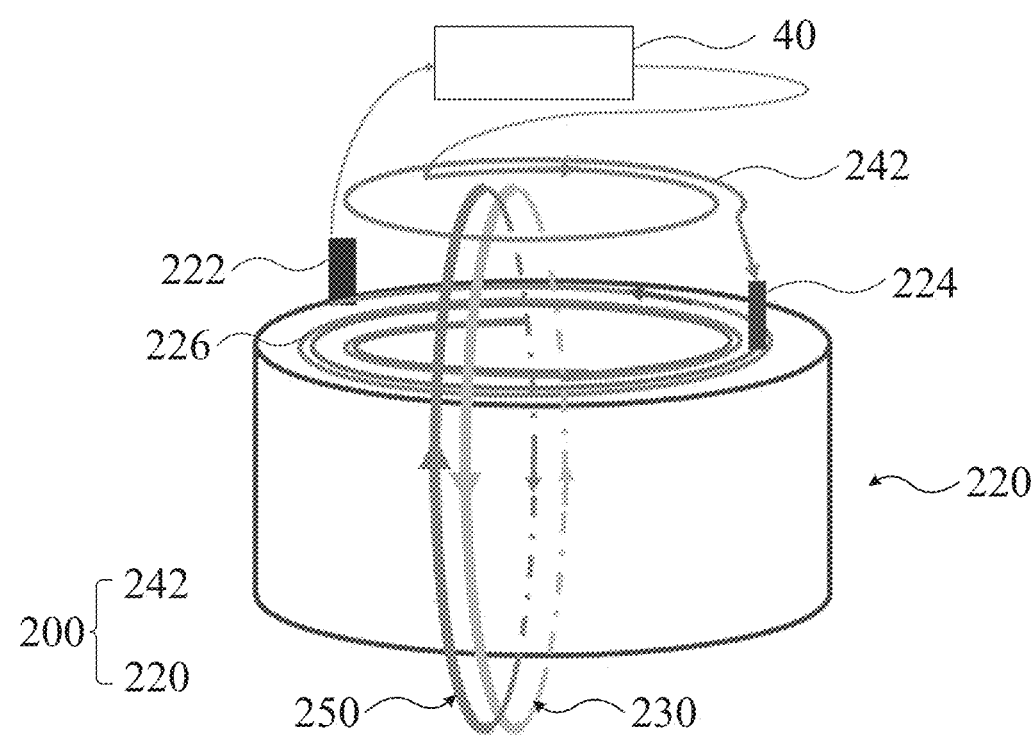
FIG. 3 is a schematic diagram of a third structure of the circuit structure provided by some embodiments of the present disclosure.
Figure 4:
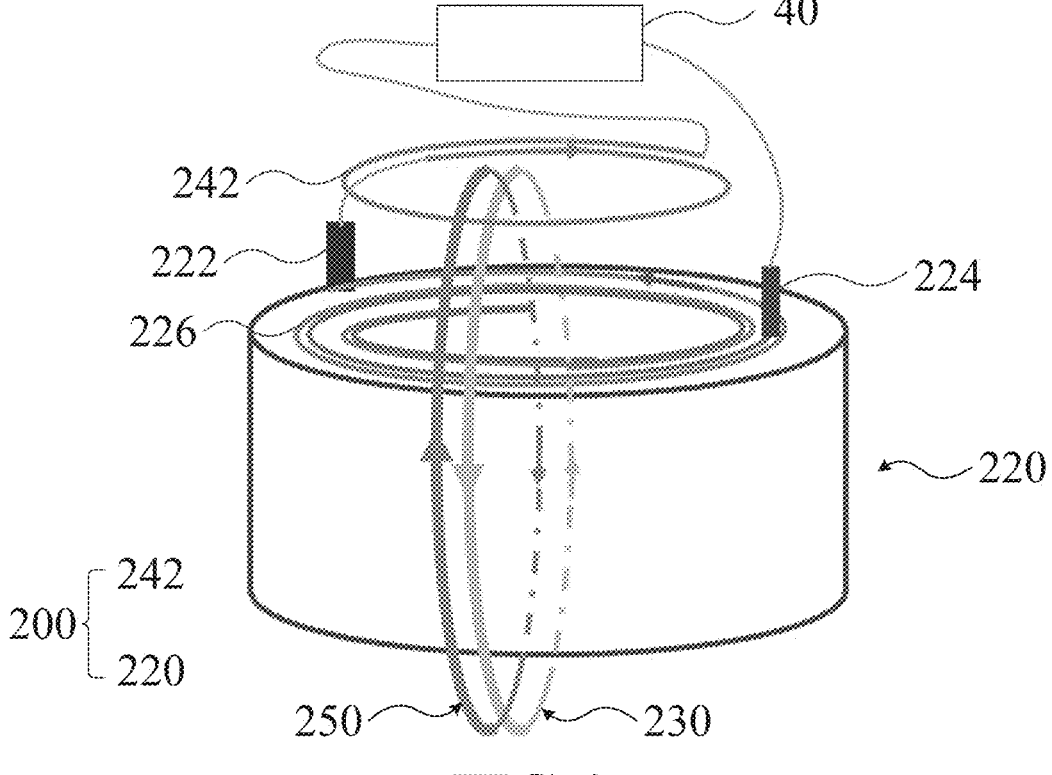
FIG. 4 is a schematic diagram of a fourth structure of the circuit structure provided by some embodiments of the present disclosure.

As shown in FIG. 3 and FIG. 4, FIG. 3 is a schematic diagram of a third circuit structure provided by some embodiments of the present disclosure, and FIG. 4 is a schematic diagram of the fourth circuit structure provided by some embodiments of the present disclosure. The battery 220 can supply the power to a load 40. The electromagnetic inductor may be a coil 242, and the coil 242 is connected to the first positive electrode 222 or the first negative electrode 224. The coil 242 is directly electrically connected to the battery cell 226, and a current in the coil 242 may be equal to the current in the battery cell 226, so that the second induced magnetic field 250 generated by the coil 242 may change with the first induced magnetic field 230 generated by the battery cell 226. It should be appreciated that, the electromagnetic inductor may also be other devices capable of generating an induced magnetic field.

It should be appreciated that, a structure of the coil may be determined based on the first induced magnetic field of the battery cell. For example, a number of turns of the coil, a diameter of the coil, a thickness of the coil, a material of the coil, etc. may be comprehensively determined based on the first induced magnetic field, so that the second induced magnetic field of the coil can cancel more of the first induced magnetic field as much as possible.

A current direction of the battery cell is opposite to a current direction of the coil. A direction of a magnetic field generated by opposite current is also opposite. Therefore, a direction of the second induced magnetic field generated by the coil is opposite to a direction of the first induced magnetic field, that is, the second induced magnetic field 250 and the first induced magnetic field 230 can cancel each other. Therefore, the total induced magnetic field of the battery is reduced or eliminated, and the interference of the total induced magnetic field of the battery on the surrounding devices is reduced.

It should be appreciated that, an electromagnetic field generated by the current is strong or weak, and its magnetic field intensity is related to a magnitude of the current. Under certain conditions, the larger the current, the larger the induced magnetic field of the current is. The induced magnetic field of the current has a direction, and the direction of the induced magnetic field can be judged by Ampere's rule, that is, a wire (conductor or current) is held by the right hand so that a pointing direction of a thumb is a flow direction of the current (the current flows from a positive electrode to a negative electrode, and the thumb points to the negative electrode), at this time, a surrounding direction of four fingers is the direction of the magnetic field.

Magnetic field formula is expressed as follows:

$$B = \frac{\mu_0 I}{2\pi r};$$

In the above formula, B is a magnitude of the magnetic field at a specific point. $\mu_0$ is a constant, and the constant depends on a nature of the material. Different materials have different constants. For example, a size of $\mu_0$ in vacuum is $4\pi \times 10^{-7}$, $\mu_G$ is a current of the conductor, and r is a distance between specific points. It can be seen that, the currents of the battery cell and the coil are equal in magnitude and current directions of the battery cell and the coil are opposite, and the magnetic fields generated by the battery cell and the coil are opposite. Selecting a proper coil structure and coil position can make the second induced magnetic field reduce or eliminate the first induced magnetic field, or make the second induced magnetic field completely cancel the first induced magnetic field at a specific position.

It should be appreciated that, the coil may be formed by a first trace formed by etching on a circuit board. For example, the circuit board has traces formed by etching, and the traces can form corresponding circuit traces and electrically connect various electrical components. For example, the coil is formed by a copper wire etched on the circuit board, and the coil formed by the copper wire on the circuit board has a small volume. It should be noted that, the circuit board can only be used for arranging the coil. For example, the circuit board is dedicated to arranging the coil. Other functional devices can also be disposed on the circuit board. For example, a circuit board with functional devices is used to arranging the coil. That is, an existing circuit board is multiplexed, and the coil is etched on the existing circuit board. Welding pads can also be disposed on the circuit board, and the welding pads can be used to electrically connect the coil, or to electrically connect the coil to external devices. The coil can also be disposed on the circuit board in other ways, such as the coil is an independent component, and then welded on the circuit board. In some other embodiments, the coil may not be disposed on the circuit board, and the coil may be formed individually, and then connected to the battery cell through corresponding wires. For example, the coil is an independent coil, which is independently disposed on one side of the battery cell through a rigidity of the coil itself.

Figure 5:
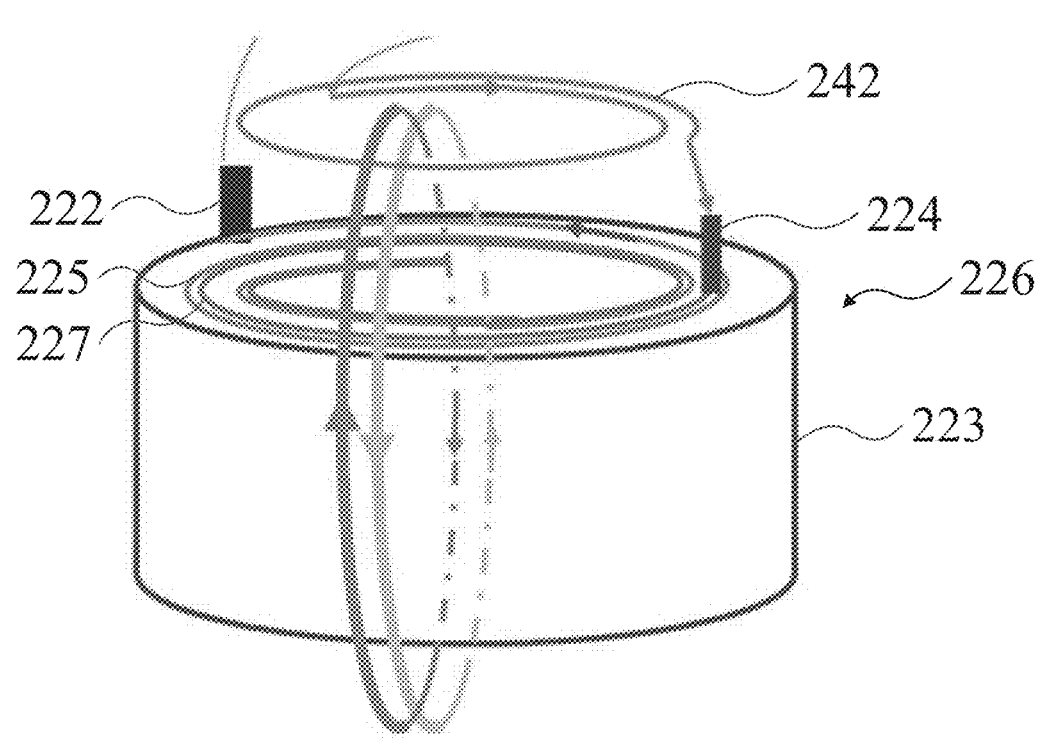
FIG. 5 is a schematic structural diagram of a battery cell of a battery shown in FIG. 3 or FIG. 4.
Figure 6:
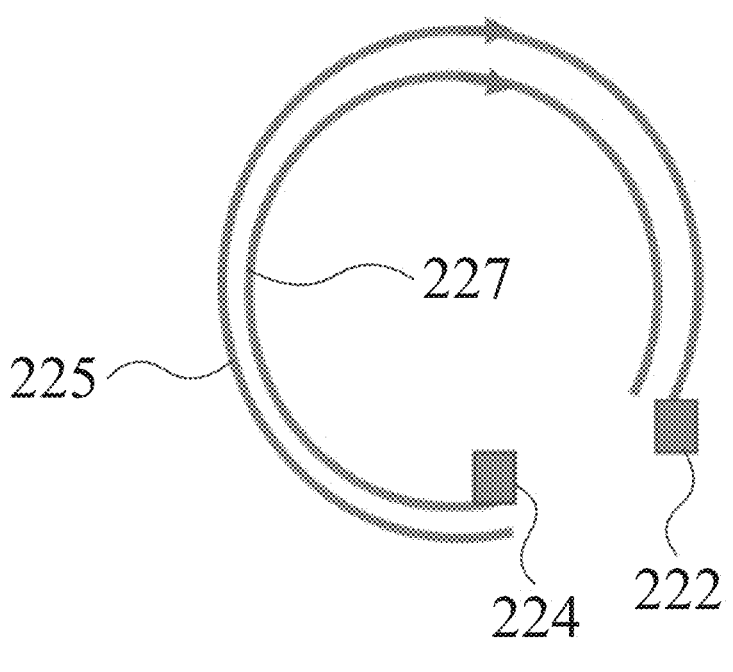
FIG. 6 is a schematic diagram of a current of the battery cell shown in FIG. 5.

As shown in FIG. 5 and FIG. 6, FIG. 5 is a schematic structural diagram of the battery cell of the battery shown in FIG. 3 or FIG. 4, and FIG. 6 is a schematic diagram of a current flow of the battery cell shown in FIG. 5. The battery cell 226 includes a main body casing 223, a positive electrode film 225 and a negative electrode film 227. The positive electrode film 225 and the negative electrode film 227 are wound and located in the main body casing 223. The positive electrode film 225 is electrically connected to the first positive electrode 222, and the negative electrode film 227 is electrically connected to the first negative electrode 224. For example, the battery cell 226, that is, the positive electrode film 225 and the negative electrode film 227 may generate a counterclockwise current, and the coil 242 generates a clockwise current. Certainly, in some other embodiments, the battery cell 226, that is, the positive electrode film 225 and the negative electrode film 227 can generate the clockwise current, and the coil 242 generates the counterclockwise current.

Figure 7:
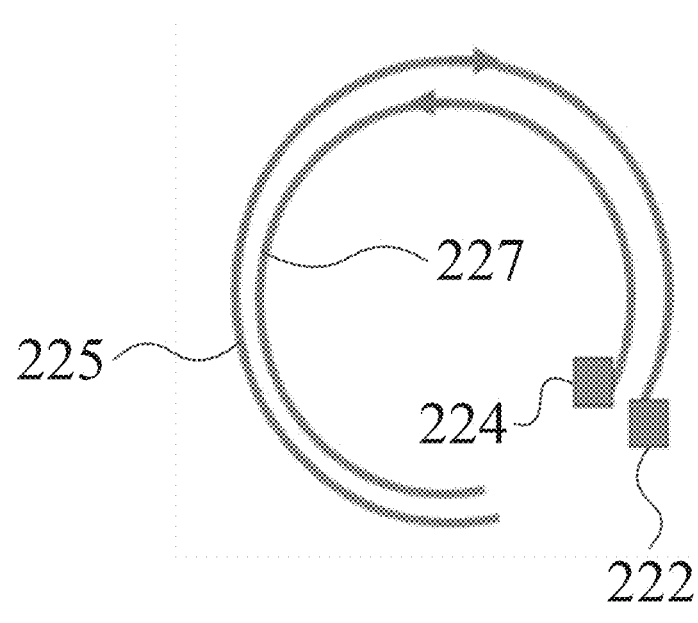
FIG. 7 is another current schematic diagram of the battery cell shown in FIG. 5.

As shown in FIG. 7, FIG. 7 is another schematic diagram of the current of the battery cell shown in FIG. 5. An inside of the battery cell 226 may also have currents in two directions, for example, the positive electrode film 225 and the negative electrode film 227 generate currents in different directions. Electromagnetic fields generated by the currents in the two directions are opposite to each other, so that an equivalent induced magnetic field of the battery cell 226 can be effectively reduced. However, due to an internal structure of the battery cell 226, the equivalent induction magnetic field still exists, and the equivalent induction magnetic field finally generated by the battery cell 226 is the first induction magnetic field 230.

Figure 8:
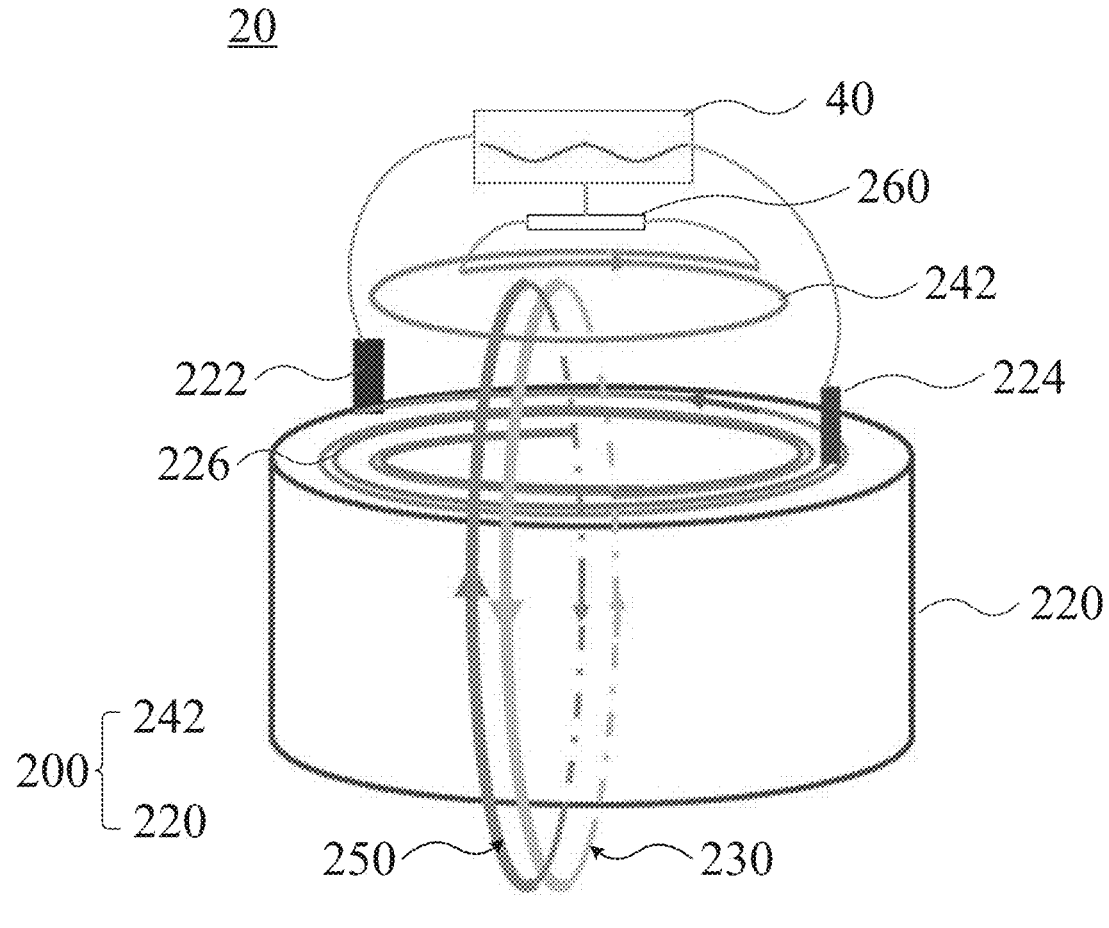
FIG. 8 is a schematic diagram of a fifth structure of the circuit structure provided by some embodiments of the present disclosure.

As shown in FIG. 8, FIG. 8 is a schematic diagram of a fifth structure of the circuit structure provided by some embodiments of the present disclosure. The circuit structure 200 may further include a current detector 260, and the current detector 260 is connected to the electromagnetic inductor 240. The current detector 260 detects a first current in the battery cell 226, and adjusts a second current in the electromagnetic inductor 240 based on the first current, wherein, the battery cell 226 generates the first induced magnetic field 230 based on the first current, and the electromagnetic inductor 240 generates the second induced magnetic field 250 based on the second current.

The electromagnetic inductor 240 may not be directly connected to the battery 220, and the current in the electromagnetic inductor 240 may or may not be equal to the current in the battery cell 226. Specifically, the current detector 260 detects and obtains the first current of the battery cell 226, and then calculates the second current required by the electromagnetic inductor 240 based on the first current, and then adjusts the second current of the electromagnetic inductor 240 correspondingly. It should be appreciated that, the battery cell 226 generates the first induced magnetic field 230 in the above embodiment based on the first current, and the electromagnetic inductor 240 generates the second induced magnetic field 250 in the above embodiment based on the second current, and the second induced magnetic field 250 can be superimposed on the first induced magnetic field 230 to weaken the magnetic field intensity of the first induced magnetic field 230. Wherein, adjusting the second current in the electromagnetic inductor 240 can be realized by a current generator or a rheostat electrically connected with the electromagnetic inductor 240, and other structures can be used to adjust the second current in the electromagnetic inductor 240 as required. The example does not limit the structure for adjusting the second current in the electromagnetic inductor 240.

Figure 9:
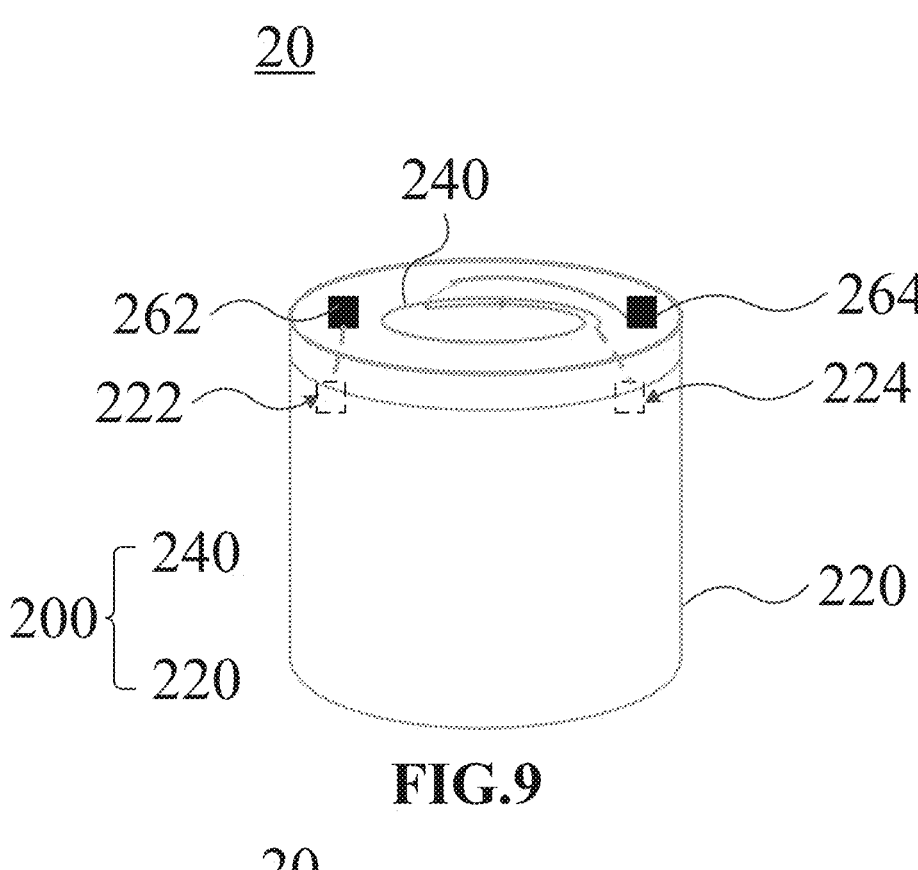
FIG. 9 is a schematic diagram of a first structure of a battery assembly provided by some embodiments of the present disclosure.
Figure 10:
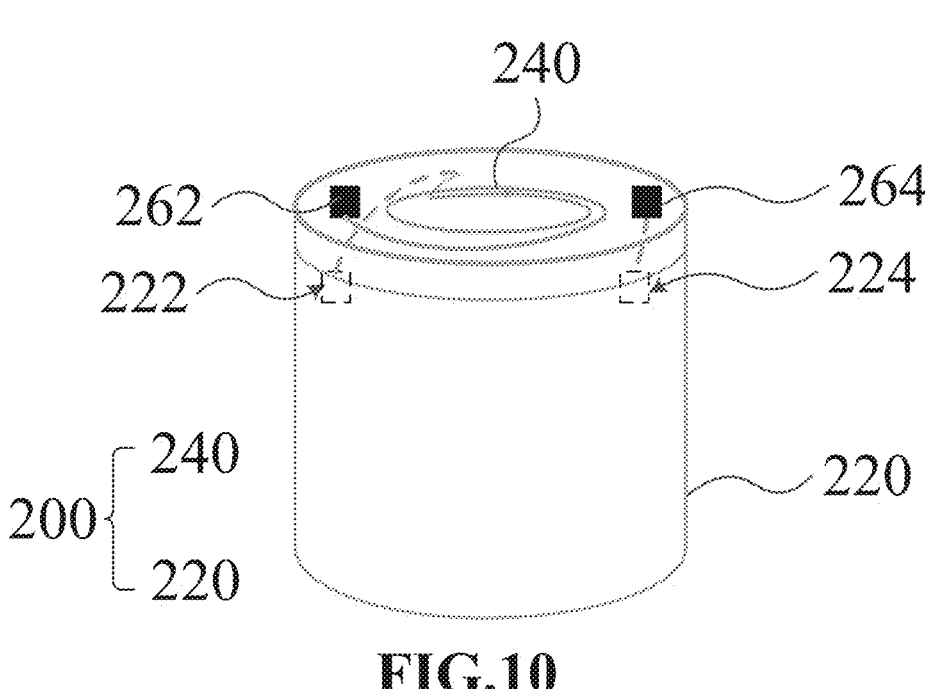
FIG. 10 is a schematic diagram of a second structure of the battery assembly provided by some embodiments of the present disclosure.

A battery assembly is provided in some embodiments of the present disclosure, as shown in FIG. 9 and FIG. 10, FIG. 9 is a schematic diagram of a first structure of the battery assembly provided by some embodiments of the present disclosure, and FIG. 10 is a second structure of the battery assembly provided by some embodiments of the present disclosure. The battery assembly 20 includes the circuit structure 200, and a structure of the circuit structure 200 can adopt the structure of the circuit structure in any one of the above-mentioned embodiments, and will not be repeated here.

When the electromagnetic inductor 240 is the coil 242, one end of the coil 242 is connected to the first positive electrode 222, and the other end is used as the third positive electrode 262 of the battery 220 assembly, or, one end of the coil 242 is connected to the first negative electrode 224, and the other end is used as the third negative electrode 264 of the battery 220 assembly.

Figure 11:
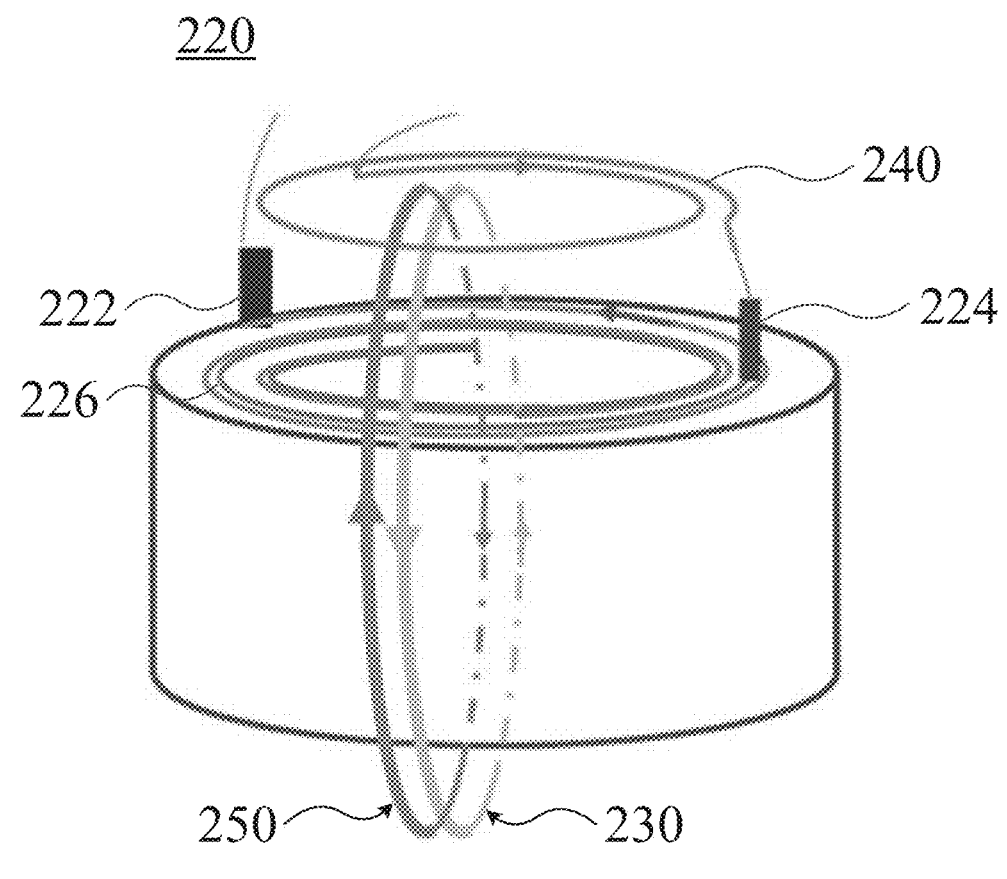
FIG. 11 is a schematic diagram of a first structure of a battery provided by some embodiments of the present disclosure.

It should be appreciated that, the electromagnetic inductor and the battery can be integrally packaged to form an integral structure. For example, the electromagnetic inductor and the battery are packaged in a housing. The electromagnetic inductor and the battery can also be an assembled structure. Specifically, the electromagnetic inductor is disposed outside the battery and assembled through other structures. For example, the electromagnetic inductor is disposed on one side of the battery and fixed on the other structures. A battery is also provided in some embodiments of the present disclosure. Specifically, as shown in FIG. 11, FIG. 11 is a schematic diagram of a first structure of the battery provided in some embodiments of the present disclosure. The battery 220 includes a first positive electrode 222, a first negative electrode 224, a battery cell 226 and an electromagnetic inductor 240. The battery cell 226 is connected between the first positive electrode 222 and the first negative electrode 224, and the battery cell 226 can supply the power to the load through the first positive electrode 222 and the first negative electrode 224. The battery cell 226 can generate the first induced magnetic field 230 when a changing current flows therethrough.

It should be appreciated that, the battery cell 226 can supply the power to the load, such as powering the acoustic-electric device, the processor, or the like. Because powers of the acoustic-electric device or the processor are different at different times, that is, the acoustic-electric device or the processor is the alternating load. The current in the acoustic-electric device or the processor changes, and the current in the battery cell 226 also changes with the current in the acoustic-electric device or the processor, so that the battery cell 226 generates the changing first induced magnetic field. The first induced magnetic field will interfere with the surrounding devices. For example, the acoustic-electric device may generate noise due to the first induced magnetic field.

The electromagnetic inductor 240 is configured to generate the second induced magnetic field 250 when the changing current flows therethrough. The second induced magnetic field 250 can be superimposed on the first induced magnetic field 230. The superimposed induced magnetic field meets requirements of the surrounding devices and different scenarios.

Figure 12:
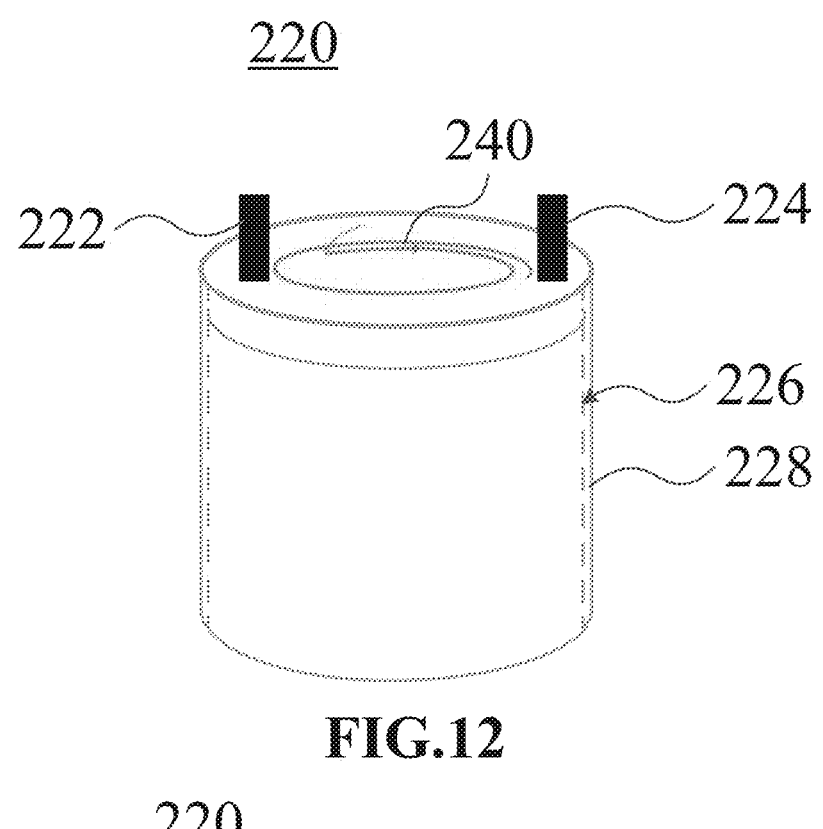
FIG. 12 is a schematic diagram of a second structure of the battery provided by some embodiments of the present disclosure.

As shown in FIG. 12, FIG. 12 is a schematic diagram of a second structure of the battery provided by some embodiments of the present disclosure. The battery 220 also includes a casing 228, a battery cell 226 and an electromagnetic inductor 240 packaged in the casing 228. The battery cell 226 and the electromagnetic inductor 240 are packaged in the casing 228 to form an integral battery 220.

An electromagnetic shielding layer may be disposed on an inner surface and/or an outer surface of the casing 228, and after the first induced magnetic field 230 is weakened by superimposing on the second induced magnetic field 250, the superimposed induced magnetic field is weakened again to reduce an effect of the battery 220 on the surrounding devices.

Figure 13:
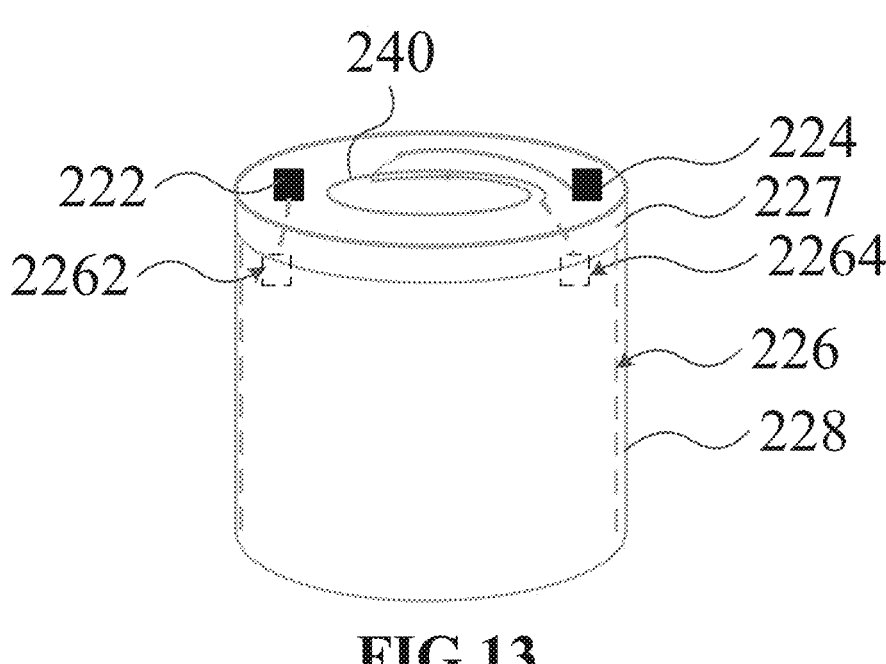
FIG. 13 is a schematic diagram of a third structure of the battery provided by some embodiments of the present disclosure.
Figures 14, 15:
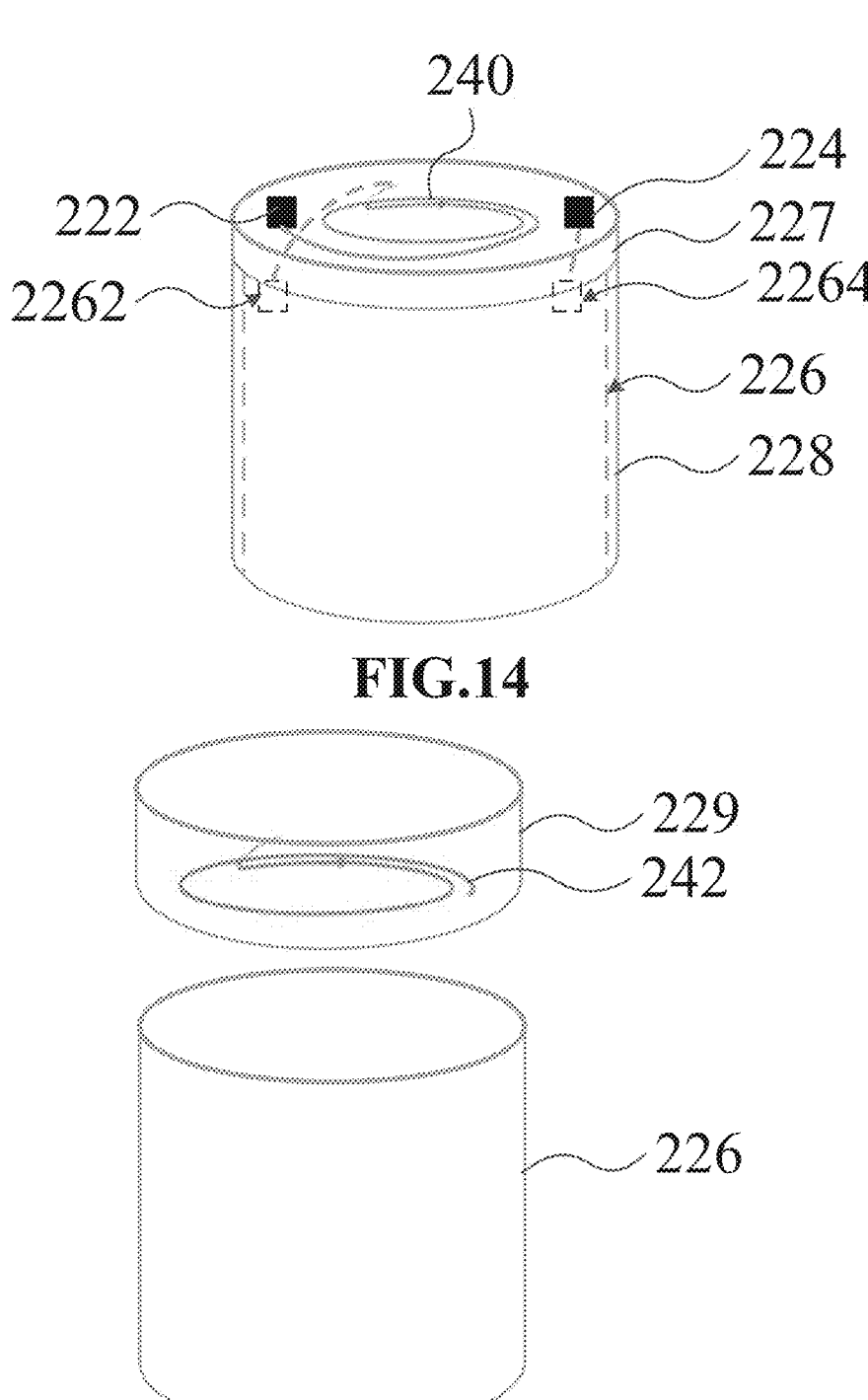
FIG. 14 is a schematic diagram of a fourth structure of the battery provided by some embodiments of the present disclosure.
FIG. 15 is a schematic diagram of a fifth structure of the battery provided by some embodiments of the present disclosure.

As shown in FIG. 13 and FIG. 14, FIG. 13 is a schematic diagram of a third structure of the battery provided by some embodiments of the present disclosure, and FIG. 14 is a schematic diagram of a fourth structure of the battery provided by some embodiments of the present disclosure. Wherein, the battery cell 226 includes a second positive electrode 2262 and a second negative electrode 2264, the electromagnetic inductor 240 is the coil 242, one end of the coil 242 is connected to the second positive electrode 2262, and the other end is connected to the first positive electrode 222; or, one end of the coil 242 is connected to the second negative electrode 2264, the other end of the coil 242 is connected to the first negative electrode 224.

The battery cell is a winding battery cell, and the coil 242 may be arranged at one end of the battery cell 226 and parallel to an end surface of the battery cell 226. By placing the coil 242 parallel to a corresponding end surface of the battery cell 226, the coil 242 can be arranged better and a space occupied by the coil 242 can be reduced. For example, the battery cell may be a columnar, and the battery cell may include a flat top surface, and the coil may be disposed on the top surface and parallel to the top surface of the battery cell. The battery cell may include an arc-shaped side, and the coil may be disposed on the side, and the coil may be also arc-shaped and parallel to a side of the battery cell. In some other embodiments, the coil 242 may not be parallel to a main body, that is, the coil 242 is disposed obliquely relative to the main body. When the second induced magnetic field generated by the coil 242 is parallel to the first induced magnetic field generated by the main body, the coil 242 will occupy more space. There is no need to dispose complicated anti-magnetic field interference structures around the battery 220, which reduces the cost. The magnetic field radiation of the battery cell 226 can be effectively and significantly cancelled by adding the coil 242, the design is ingenious and effective, the improvement effect on the magnetic field interference is stable and reliable, and the influence on the size of the battery 220 is very small.

The battery 220 also includes an insulating layer 227, and the insulating layer 227 is disposed between the battery cell 226 and the coil 242. The coil 242 can be adjacent to the main body through the insulating layer 227, so as to ensure that the coil 242 is insulated from the battery cell 226, and generate opposite magnetic fields to cancel each other. It should be appreciated that, a thickness of the insulating layer 227 can be adjusted as required, so that the second induced magnetic field 250 can better cancel the first induced magnetic field 230.

As shown in FIG. 15, FIG. 15 is a schematic diagram of a fifth structure of the battery provided by some embodiments of the present disclosure. The battery 220 further includes a protective element 229, the electromagnetic inductor 240 is disposed in the protective element 229, and the protective element 229 is adjacent to the battery cell 226.

The electromagnetic inductor 240 is disposed in the protective element 229, the protective element 229 can protect the electromagnetic inductor 240, and the protective element 229 can be a box or other structures. For example, the protective element 229 is formed after a colloid is cured. The electromagnetic inductor 240 is first embedded in the colloid, and the colloid is cured to form the protective element 229. The protective element 229 may be an insulating material. The protective element 229 can be an insulating box, or can be formed by curing insulating glue.

With continued reference to FIG. 2, it should be appreciated that, the magnetic field direction and the magnetic field intensity of the second induction magnetic field 250 of the electromagnetic inductor 240 are hardly identical to the magnetic field direction and the magnetic field intensity of the first induced magnetic field 230. In order to reduce the effect on part of some surrounding devices, the electromagnetic inductor 240 can be reasonably arranged, so the magnetic field intensity of the first induced magnetic field 230 is weakened at the position of the surrounding devices. Specifically, the electromagnetic inductor 240 can be arranged at the first position 320 in the first induced magnetic field 230, so that the magnetic field intensity at the second position 340 in the first induced magnetic field 230 is weakened after the second induction magnetic field 250 is superimposed on the first induction magnetic field 230.

The electromagnetic inductor 240 can be disposed on the first position 320 first, and then the second position 340 where the first induced magnetic field 230 is weakened by the second induced magnetic field 250 can be calculated, and the surrounding devices can be disposed on the second position 340, the magnetic field intensity at a position of the surrounding devices disposed on the second position 340 is relatively small, that is, the magnetic field intensity that interferes the surrounding devices is small, which weakens the interference to the surrounding devices.

It is also possible to dispose the surrounding devices on the second position 340 first, and then calculate a required second induced magnetic field 250 according to the magnetic field intensity that needs to be weakened in the second position 340 in the first induced magnetic field 230, and then select a suitable electromagnetic inductor 240 and place the suitable electromagnetic inductor 240 in a suitable position to achieve the above requirements.

It should be appreciated that, when the surrounding devices requires a larger magnetic field intensity, after the second induced magnetic field is superimposed on the first induced magnetic field, the magnetic field intensity of the first induced magnetic field is enhanced. It can also be appreciated that, the total induced magnetic field of the circuit structure is formed after the first induced magnetic field and the second induced magnetic field are superimposed, and the magnetic field intensity of the total induced magnetic field is stronger than the magnetic field intensity of the first induced magnetic field, so that the influence on the surrounding devices can be enhanced.

For example, when the surrounding device is the preset magnetic induction device, the preset magnetic induction device can receive the first induced magnetic field and convert it into electrical energy. After the second induced magnetic field is superimposed on the first induced magnetic field, the preset magnetic induction device is affected by the total induced magnetic field, that is, the preset magnetic induction device is affected by the second induced magnetic field and the first induced magnetic field superimposed with each other, and can convert more electric energy.

Figure 16:
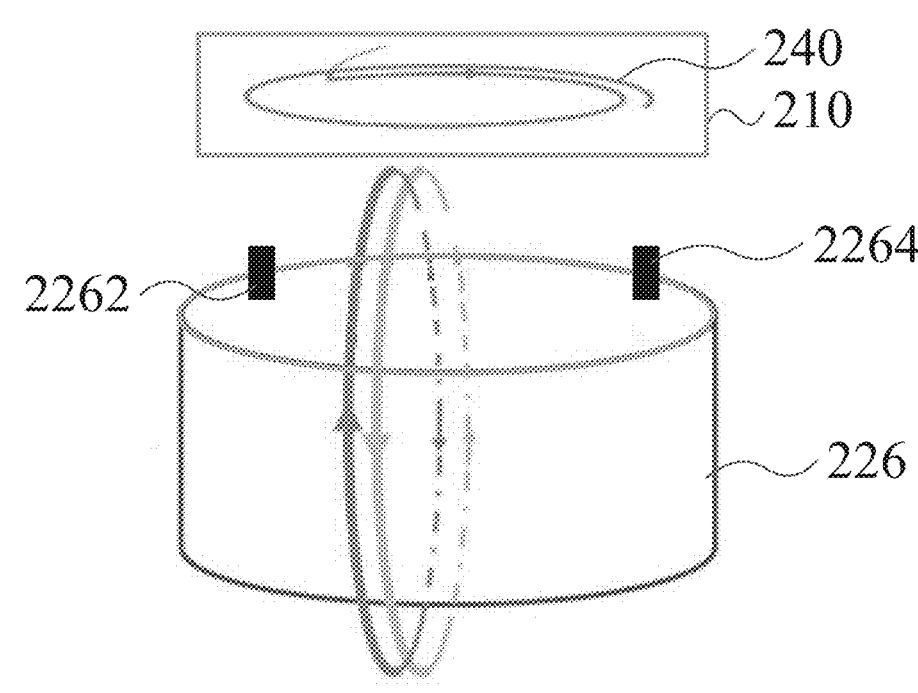
FIG. 16 is a schematic diagram of a sixth structure of the battery provided by some embodiments of the present disclosure.

As shown in FIG. 16, FIG. 16 is a schematic diagram of a sixth structure of the battery provided by some embodiments of the present disclosure. The battery 220 may further include a circuit board 210, and the electromagnetic inductor 240 is disposed on the circuit board 210. The circuit board 210 can be used as a carrier of the electromagnetic inductor 240, so that the electromagnetic inductor 240 is conveniently disposed. It should be appreciated that, the electromagnetic inductor may not be disposed on the carrier, but is independently disposed by characteristics of a material itself. It should be noted that, in the figure, the circuit board can be disposed at intervals with the battery cell 226, or can be disposed adjacent to the battery cell 226.

Figure 17:
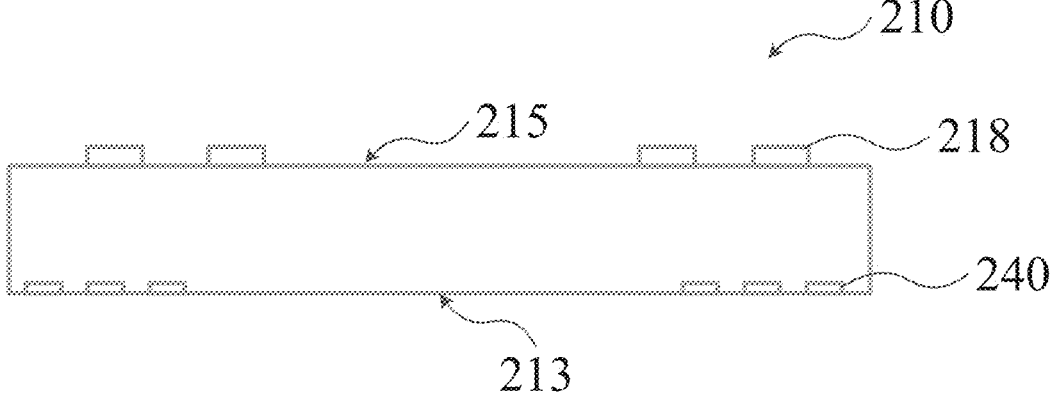
FIG. 17 is a schematic cross-sectional view of a circuit board in the battery shown in FIG. 16.

As shown in FIG. 17, which is a schematic cross-sectional view of the circuit board in the battery shown in FIG. 16. The circuit board 210 includes a first side 213 and a second side 215 opposite to each other, the electromagnetic inductor 240 is disposed on the first side 213, and a functional element 218 is disposed on the second side. It should be appreciated that, the electromagnetic inductor 240 can be multiplexed on the circuit board 210 on which the functional element 218 is disposed. The battery 220 can supply the power to the functional element 218, such as the processor, on the circuit board 210, and the electromagnetic inductor 240 is disposed on the first side 213 opposite to the functional element 218, which does not affect a setting of the functional element 218 and makes full use of the first side 213. The effect on the circuit board 210 is very small, and the circuit board 210 can be multiplexed conveniently.

It should be appreciated that, the first side 213 can be a bottom surface of the circuit board 210, the second side 215 can be a top surface of the circuit board 210, and the functional element 218 can be attached or welded on the top surface, and the bottom surface is generally not set or set fewer functional components, and the bottom surface has a large blank area, so that the bottom surface has a condition for disposing the electromagnetic inductor, and the electromagnetic inductor can be conveniently disposed on the bottom surface. Wherein, the functional element 218 may include functional elements such as an elastic sheet or a pole lug, and may also include functional elements such as a processor and a memory. The circuit board equipped with the electromagnetic inductor and the functional element can be mass-produced and controlled with good consistency.

The electromagnetic inductor can be disposed on a side of the circuit board 210 facing the battery cell 226, and the electromagnetic inductor is closer to the battery cell 226, so that the second induced magnetic field 250 generated by the electromagnetic inductor can better reduce or cancel the first induced magnetic field 230. The electromagnetic inductor can also be disposed on a side of the circuit board away from the battery cell 226 as required, and the electromagnetic inductor is not disposed on the side of the circuit board facing the battery core 226, and no components or few components are disposed on, so that the circuit board is conveniently attached to the battery cell 226.

The electromagnetic inductor can be the coil. Wherein, the coil disposed on the circuit board can be an independent component, that is, the coil is manufactured first, and then the coil is installed on the circuit board. The circuit board is a carrier of the coil, which is convenient for installing and setting the coil. Moreover, the coil can be connected to the negative electrode of the battery cell through a pad on the circuit board, and can be used as the negative electrode of the battery through the pad on the circuit board or other devices. It should be appreciated that, the coil can also be connected to the positive electrode of the battery cell through the pad on the circuit board, and can be used as the positive electrode of the battery through the pad on the circuit board or other devices.

Figure 18:
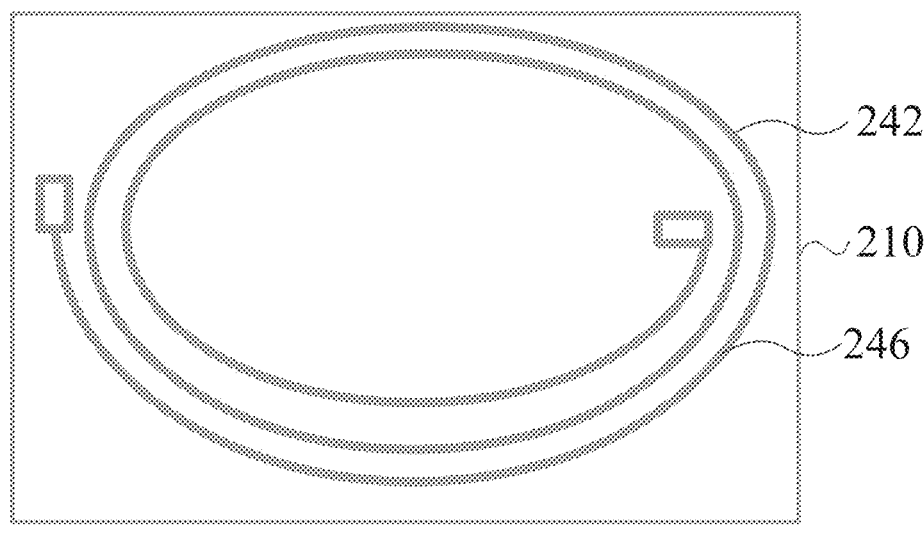
FIG. 18 is a schematic structural diagram of the circuit board in the battery provided by some embodiments of the present disclosure.

The coil can also be formed in other ways. For example, as shown in FIG. 18, FIG. 18 is a schematic structural diagram of a circuit board in a battery provided by some embodiment of the present disclosure. The circuit board 210 has a first trace 246 formed by etching, and the first trace 246 forms the coil 242. Therefore, when manufacturing the circuit board 210, the coil 242 can be directly etched on the circuit board 210 without increasing a thickness of the circuit board 210. For example, the coil 242 formed by a copper wire is etched on the circuit board 210, and the coil 242 formed by the copper wire of the circuit board 210 has small size. It should be noted that, the circuit board 210 may only be used for setting the coil 242. For example, the circuit board 210 on which the coil 242 is set is added. Other functional devices may also be set on the circuit board 210. For example, the circuit board 210 with the functional devices is used to add and set the coil 242.

A line width of the first trace 246 forming the coil body, a number of turns of the coil 242, a distance between the coil 242 and the battery cell 226, a diameter of the coil 242 or the like can be set as required. It should be appreciated that, when the number of turns of the coil 242 is large, the magnetic field intensity of the second induced magnetic field 250 can be increased, but an area of the second induced magnetic field 250 will be reduced. The first trace 246 can be disposed on an edge of the circuit board 210 to ensure that the area of a generated second induced magnetic field 250 is not too small. After a setting location of the first trace 246 is determined, the number of turns of the coil 242 is determined, so that the second induced magnetic field 250 can better reduce the first induced magnetic field 230. In other embodiments, the first trace forming the coil may also be disposed in the middle of the circuit board.

The circuit board can be stacked on a surface of the battery cell. For example, the circuit board can be adjacent to the battery cell, and it can also be appreciated that the circuit board can cover the surface of the battery cell, and the circuit board is directly stacked on the surface of the battery cell. Wherein, a first bonding pad may be disposed on the circuit board, the first bonding pad is connected to one end of the coil, and the first bonding pad abuts against the negative electrode of the battery cell. The coil is connected to the negative electrode of the battery cell through the first bonding pad, and does not need to be connected through other connecting parts such as wires, the distance between the coil and the battery cell is minimized, and a volume of the battery is minimized. Wherein, the circuit board can be adhered to the battery cell, such as the circuit board can be adhered to the battery cell by double-sided adhesive tapes or other adhesive layers. The circuit board can also be installed on the battery cell by other methods, such as welding fixation, screwing fixation or the like.

Figure 19:
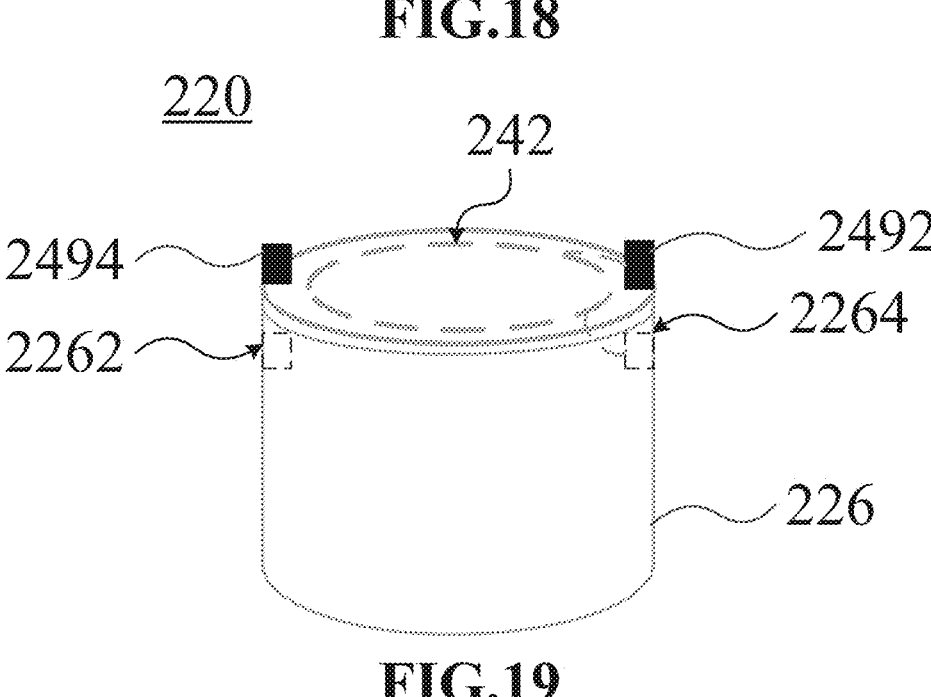
FIG. 19 is a schematic diagram of a seventh structure of the battery provided by some embodiments of the present disclosure.

As shown in FIG. 19, FIG. 19 is a schematic diagram of a seventh structure of the battery provided by some embodiments of the present disclosure. A first connection end 2492 and a second connection end 2494 is disposed on the side of the circuit board 210 away from the battery cell 226. The first connection end 2492 is connected to the second negative electrode 2264 through the coil 242, and is used as the negative electrode of the battery 220. The second connection end 2494 is connected to the second positive electrode 2262, and is used as the positive electrode of the battery 220.

The circuit board 210 can cover the surface of the battery cell 226. The first connection end 2492 and the second connection end 2494 on the circuit board 210 are used as the positive electrode and negative electrode of the battery 220. The first connection end 2492 and the second connection end 2494 are connected to the load and supply the power to the load. Positions of the first connection end 2492 and the second connection end 2494 on the circuit board 210 can be set as required, such as the first connection end 2492 and the second connection end 2494 are disposed at two ends of the circuit board 210, or the first connection end 2492 and the second connection end 2494 are adjacently disposed at one end or in the middle of the circuit board 210.

The first connection end 2492 and the second connection end 2494 can be set as conductive structures such as metal sheets, bonding pads, or elastic sheets as required. Metal sheets can be nickel sheets, copper sheets or metal sheets of other materials. It should be appreciated that, in order to better connect the battery with the external devices, connectors may be disposed on the first connection end and/or the second connection end for easy connection with the external devices.

It should be appreciated that, the second positive electrode 2262 and the second negative electrode 2264 of the battery cell 226 can be disposed on one side of the battery cell 226, and then connected to the first connection end 2492 and the second connection end 2494 through the bonding pads or elastic sheets on the circuit board 210. The second positive electrode and the second negative electrode of the battery cell 226 can also be disposed on different sides of the battery cell 226, and then the second positive electrode and/or the second negative electrode are connected to the first connection end 2492 and the second connection end 2494 through wires or other connection structures.

Figure 20:
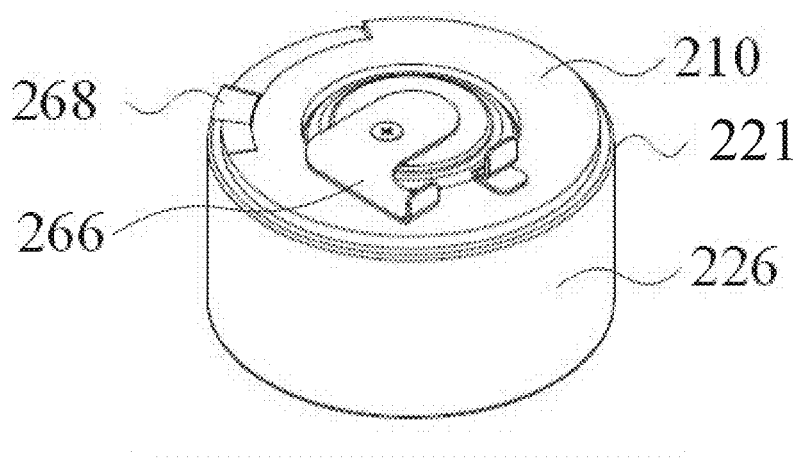
FIG. 20 is a schematic diagram of an eighth structure of the battery provided by some embodiments of the present disclosure.
Figure 21:
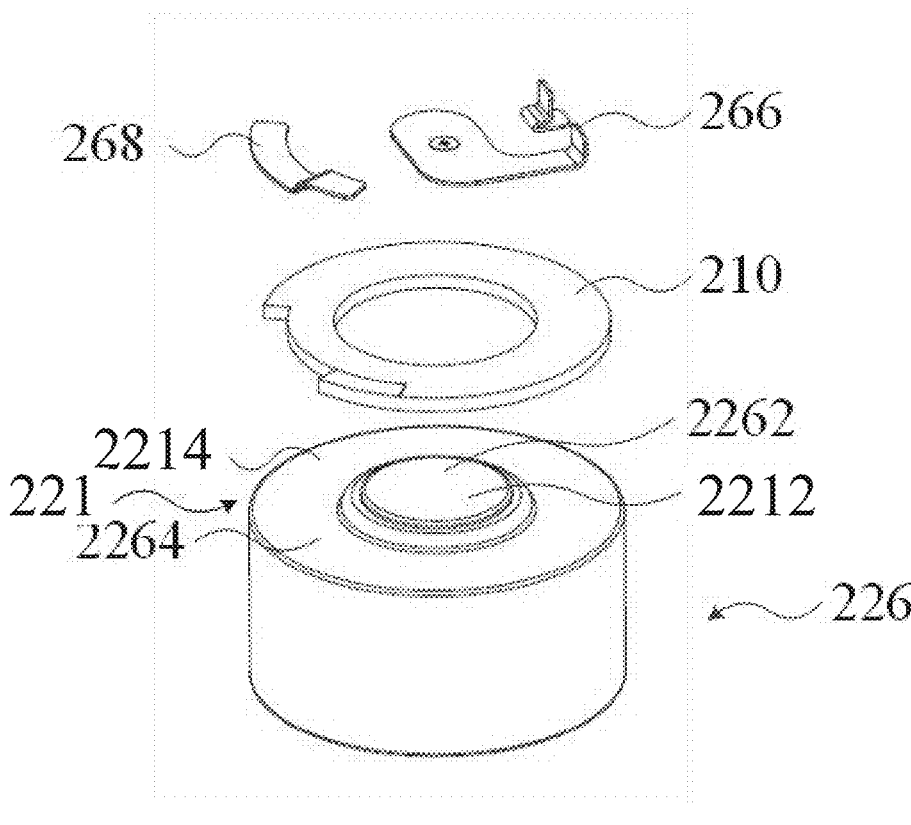
FIG. 21 is an exploded view of the battery shown in FIG. 20.

As shown in FIG. 20 and FIG. 21, FIG. 20 is a schematic diagram of a fifth structure of the battery provided by some embodiments of the present disclosure, and FIG. 21 is an exploded view of the battery shown in FIG. 20. The battery cell 226 may include a first end portion 221, and the second positive electrode 2262 and the second negative electrode 2264 are both disposed on the first end portion 221. The circuit board 210 is adjacent to the first end portion 221, the circuit board 210 has an opening, the second positive electrode 2262 is exposed from the opening, and the second positive electrode 2262 is used as the positive electrode of the battery 220. The first connection terminal is disposed on the side of the circuit board 210 away from the battery cell 226, the first connection end is connected to the second negative electrode 2264 of the battery cell 226 through the coil, and the first connection end is used as the negative electrode of the battery cell 226.

The first end portion 221 of the battery cell 226 may include a protruding bump 2212 and a peripheral portion 2214 surrounding a bump 2212, the bump 2212 is exposed from the opening, the second positive electrode 2262 is disposed on the bump 2212, and the second negative electrode 2264 is disposed on the peripheral portion 2214. The circuit board 210 can be an annular plate, exposes the bump 2212 in the middle of the battery cell 226, and covers the peripheral portion 2214 surrounding the bump 2212, so that a shape of the battery cell 226 is not influenced, and a connection of the battery 220 and other devices is not influenced.

It should be noted that, the circuit board 210 can cover the second negative electrode 2264, and one end of the coil on the circuit board 210 can be connected to the second negative electrode 2264, the first connection end 2492 disposed at an end away from the battery cell 226 can be used as the negative electrode of the battery, and the first connection end 2492 is connected to the other end of the coil. Wherein, the first connection end can be connected to the other end of the coil through a via hole on the circuit board.

The battery 220 may further include a first lead-out structure 268 and a second lead-out structure 266, the first lead-out structure 268 is connected to the second negative electrode through the coil, the second lead-out structure 266 is connected to the second positive electrode. The battery can be conveniently connected to the external devices through the first lead-out structure 268 and the second lead-out structure 266, thereby supplying the power to the external devices. It should be appreciated that, the second lead-out structure can be selected and set as required. For example, in some embodiments, the power is supplied to the external devices directly through the second positive electrode on the bump in cooperation with the first lead-out structure 268 without disposing the second lead-out structure 266.

It should be appreciated that, the circuit board can also be in other shapes, as long as the circuit board has the opening to expose the second positive electrode. For example, sides or corners of the circuit board have the opening.

The battery cell may include a first end face and a second end face, the first end face and the second end face are disposed opposite or adjacent to each other, the second negative electrode is disposed on the first end face, and the second positive electrode is disposed on the second end face. The circuit board is adjacent to the first end surface, and the coil is connected to the second negative electrode. The circuit board is disposed on the first end face, and the coil on the circuit board is connected to the second negative electrode without affecting the second end face and the second positive electrode of the battery. When the battery is connected to the external devices, the second negative electrode of the battery cell is connected to the external devices through the coil of the circuit board, and the second positive electrode of the battery cell is not affected, and can be directly connected to the external devices. Wherein, the first end surface and the second end surface may be two opposite end surfaces of the battery cell. For example, the first end surface and the second end surface are a top end surface and a bottom end surface of the battery cell. In one embodiment, the first end surface and the second end surface may also be two adjacent end surfaces of the battery cell. The first end face and the second end face can also be the top end face and a side end face of the battery cell.

The battery cell in this embodiment can be used as a battery independently, or can be packaged together with circuit board that has the coil to be used as a battery.

It should be appreciated that, the thickness of the circuit board in the above embodiment is relatively small. For example, the circuit board may be a rigid circuit board, and a thickness of the rigid circuit board may be equal to or less than 0.4 mm. The circuit board may be a flexible circuit board, and a thickness of the flexible circuit board may be equal to or less than 0.1 mm.

Figure 22:
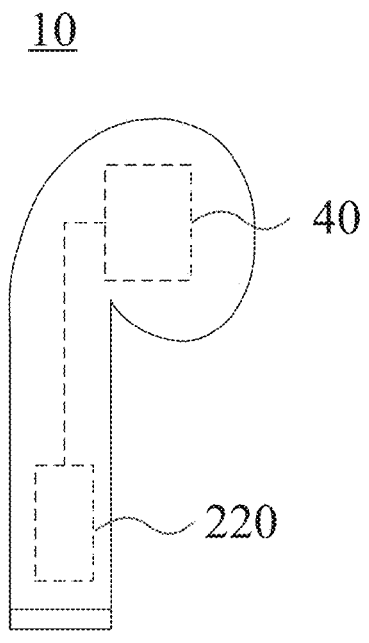
FIG. 22 is a schematic diagram of a first structure of an electronic device provided by some embodiments of the present disclosure.

An electronic device is also provided in present embodiment, as shown FIG. 22 for details, FIG. 22 is a first structural schematic diagram of the electronic device provided by some embodiments of the present disclosure. The electronic device 10 includes a load 40 and a battery 220. The battery 220 is connected to the load 40 and supplies a power to the load 40. A structure of the battery 220 can adopt the structure of the battery 220 in any one of the above-mentioned embodiments, and will not be repeated here.

Figure 23:
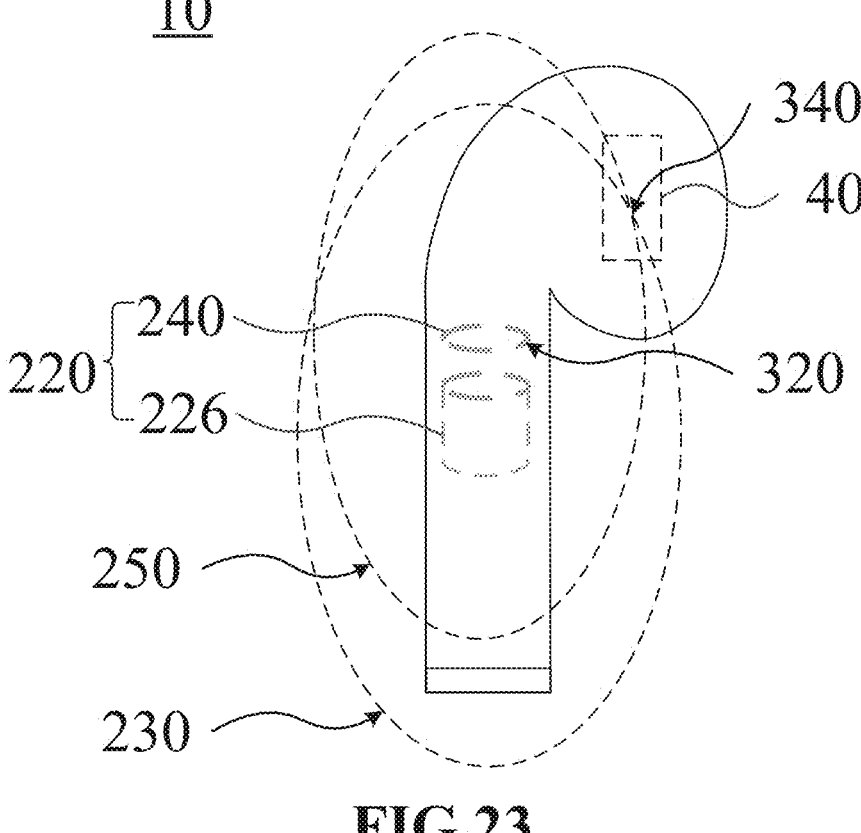
FIG. 23 is a schematic diagram of a second structure of the electronic device provided by some embodiments of the present disclosure.

As shown in FIG. 23, FIG. 23 is a second structural schematic diagram of the electronic device provided by some embodiments of the present disclosure. The load 40 can be an electromagnetic device. When the electromagnetic inductor 240 is disposed at the first position 320 in the first induced magnetic field 230 of the battery cell 226, the electromagnetic device is disposed at the second position 340 in the first induced magnetic field 230, so that after the second induced magnetic field 250 is superimposed on the first induced magnetic field 230, the magnetic field intensity at the second position 340 in the first induced magnetic field 230 is weakened. Wherein, the electromagnetic device may be an electromagnetic sensitive device, such as an electro-acoustic device or an antenna.

It should be noted that, relative position of the battery cell 226 and the electromagnetic inductor 240 in the figure are only schematic diagrams, and the relative positions between the battery cell 226 and the electromagnetic inductor 240 can be adjusted as required. For example, the battery cell and the electromagnetic inductor are separated by a certain distance, or the battery cell and the electromagnetic inductor are arranged adjacently, or the electromagnetic inductor is located between the battery cell and the load, or the electromagnetic inductor is disposed on the side of the battery cell away from the load.

The electro-acoustic device may be a microphone, a loudspeaker and other devices.

The electronic device may be an audio playback device such as an earphone or a speaker. The earphone includes a battery, the electro-acoustic device and other devices. Considering a small size of the earphone and a short distance between the battery and the electro-acoustic device, the magnetic field of the battery is easy to affect the electro-acoustic device, causing an interference to the electroacoustic device and generating noise. Adding the coil to the battery can effectively reduce the magnetic field of the battery, so that the interference of the electroacoustic device is improved, and a noise of the electroacoustic device due to the magnetic field of the battery is reduced or eliminated. Similarly, a miniaturized speaker also has similar problems. The battery of the miniaturized speaker can also add the coil, so that the magnetic field of the battery can be effectively reduced, and the interference of the electro-acoustic device is improved.

The electronic device may also include a device housing, and the electro-acoustic device and the battery are both located in the device housing. For a miniaturization of the electro-acoustic device, a volume of the device housing is small, and the electro-acoustic device is close to the battery. When the magnetic field of the battery is large, the electro-acoustic device is easily interfered by the magnetic field and generates noise. The battery in present embodiment effectively cancels the induced magnetic field of the battery by the electromagnetic inductor, such as the coil, the influence on the electro-acoustic device is small, and the noise of the electro-acoustic device caused by the induction magnetic field of the battery can be improved or eliminated.

The earphone in present embodiment may be an earphone with its own battery, such as a Bluetooth earphone, and the speaker may be a speaker with its own battery, such as a Bluetooth speaker. It should be appreciated that, the electronic device can also include a wireless communication module to realize wireless communication, and the wireless communication module can obtain an external information to control the electro-acoustic device, such as controlling an electronic equipment to play audio, or controlling the electronic equipment to switch songs, etc.

Figure 24:
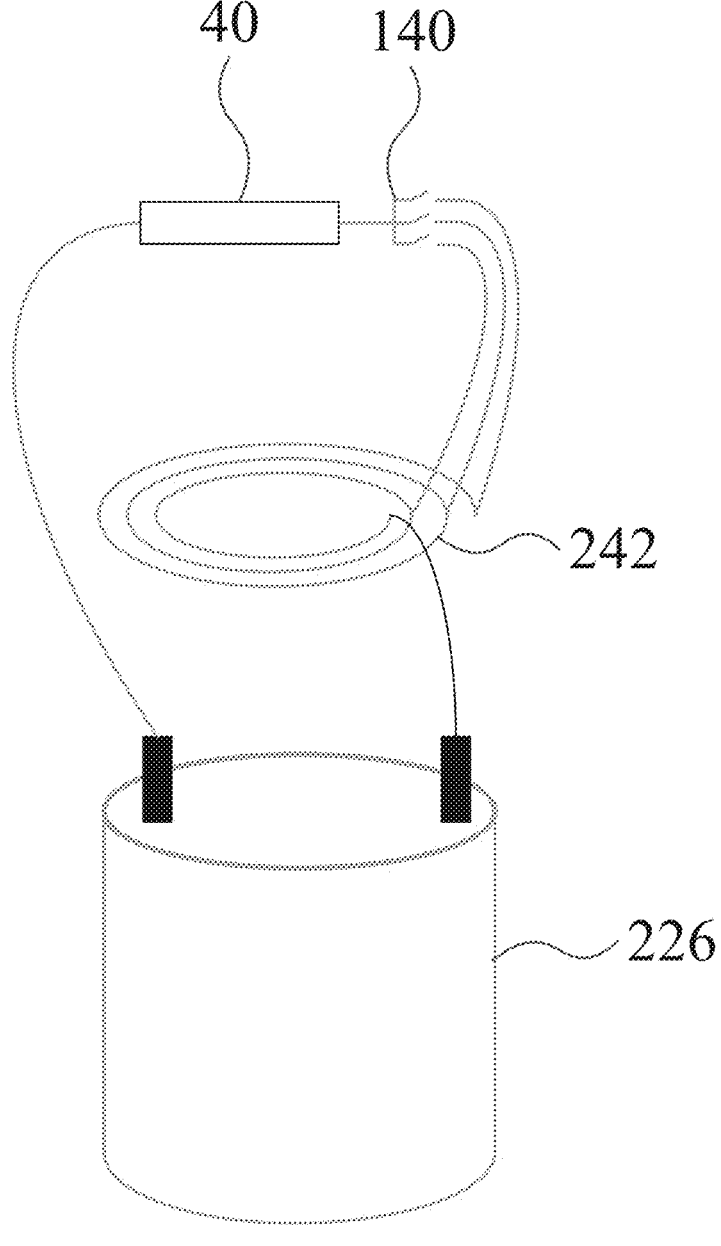
FIG. 24 is a schematic structural diagram of the battery in the electronic device shown in FIG. 22.

As shown in FIG. 24, FIG. 24 is a schematic structural diagram of the battery in the electronic device shown in FIG. 22. In some embodiments, the coil 242 can include a plurality of connection points. The plurality of connection points is used to connect to the positive electrode or the negative electrode of the battery cell 226, or the plurality of connection points is connected to the load 40. Each connection point can be controlled by a switch 140 to realize a conduction or a disconnection between the connection point and the positive electrode or the negative electrode of the electric cell 226, and the conduction or the disconnection between the connection point and the load 40. The magnitude of the second induced magnetic field generated by connecting the positive electrode or the negative electrode of the battery cell 226 to different connection points is different. Combining with a magnetic field formula $$B = \frac{\mu_0 I}{2\pi r},$$

the different connection points can be understood as changing the value of r therein, so that the second induced magnetic field generated by the coil 242 can be changed.

The different connection points are connected to the load so that the coil generates different second induced magnetic fields. After the different second induced magnetic fields are superimposed on the first induced magnetic field, the magnetic field intensity at different positions of the first induced magnetic field is weakened, that is, suitable connection points can be selected by the external devices in different positions. For example, adjacent batteries in the electronic device have a first external device and a second external device, and the first external device and the second external device are disposed at different positions. When the first external device is working, a first connection point of the coil is connected to the load, so that the second induced magnetic field generated by the coil completely cancels or reduces the first induced magnetic field generated by the battery cell at the first external device, thereby improving an electromagnetic radiation interference of the first external device. When the second external device is working, a second connection point of the coil is connected to the load, so that the second induced magnetic field generated by the coil completely cancels or reduces the first induced magnetic field generated by the battery cell at the second external device, thereby improving the electromagnetic radiation interference of the second external device.

For example, the preset position at which the second induced magnetic field cancels the first induced magnetic field can be changed by adjusting the connection point. The different connection points correspond to different preset positions. At the preset position, the second induced magnetic field can significantly weaken the magnetic field intensity of the first induced magnetic field. Corresponding to the electronic devices with different shapes, the preset position can be changed by adjusting the connection point, and the preset position can be used to dispose the electromagnetic sensitive device such as the speaker and the microphone. Due to a limitation of a shape of different electronic devices, the positions of the battery cell and the electromagnetic sensitive device are different. The electronic devices with different shapes can be adapted by selecting the different connection points, or a setting position of the electromagnetic sensitive device can be changed in the same electronic device, so that the positions of different devices in the electronic device can be conveniently set and adjusted.

In addition, the second induced magnetic field generated by the coil can cancel the first induced magnetic field generated by the battery cell at the preset position, but considering an aging degree of the battery cell and the coil, the different connection points can be selected according to a length of use, so that even the battery cell has been used for a long time, the magnetic field intensity at the preset position can still be very small, and it will not cause a gap between the first induced magnetic field and the second induced magnetic field at the preset position to gradually increase due to different aging degrees between the battery cell and the coil.

The coil may include a plurality of sub-circles, each sub-circle is one circle, and the connection points may be disposed on different sub-circles. Each connection point is connected through one control line, the control line is connected to a switch, the switch and the coil are arranged at intervals, and the switch will not affect the coil. For example, the switch is arranged on the circuit board where the load is located. For another example, the circuit board is arranged at intervals with the battery core and the coil, a switch group is disposed on the circuit board, the switch group is connected to control lines, and one of the control lines is selected to be connected to the coil, so that a number of sub-turns of the coil is changed. The switch can be single-pole single-throw, single-pole multiple-throw, etc., and can also be a field effect transistor, etc.

It should be appreciated that, the circuit structure and the coil in the battery or the battery assembly in any one of the above embodiments may adopt the structure in which the coil includes a plurality of connection points in present embodiment, which will not be repeated here.

Figure 25:
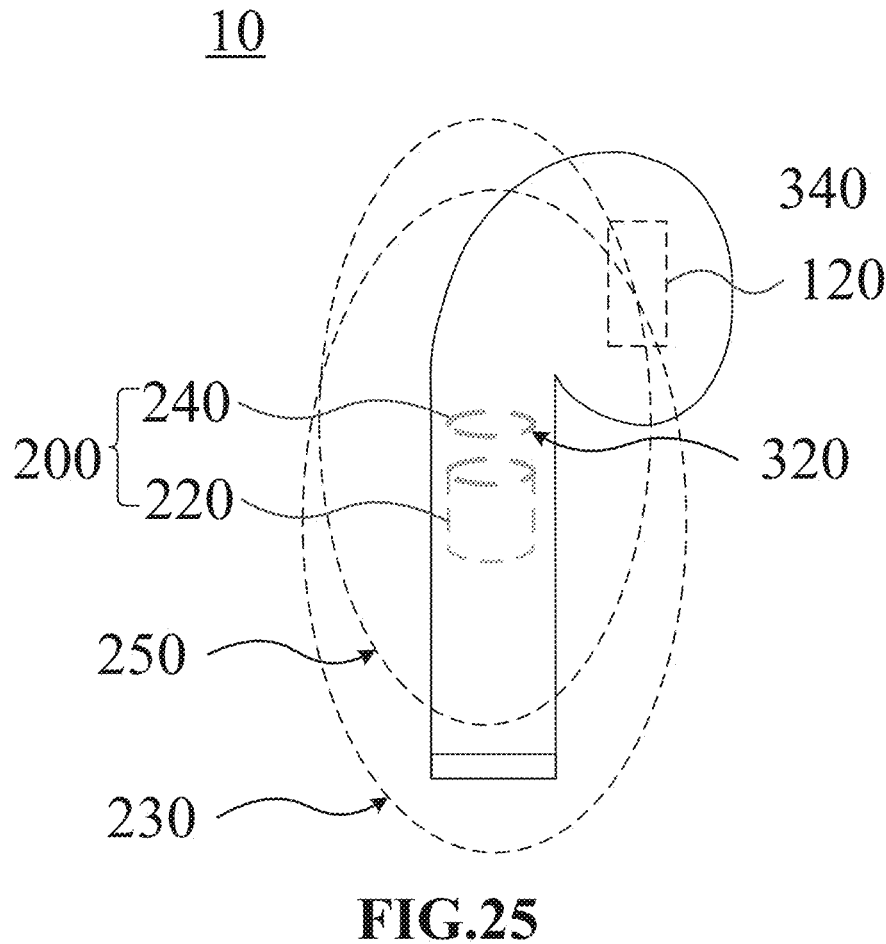
FIG. 25 is a schematic diagram of a third structure of the electronic device provided by some embodiments of the present disclosure.

An electronic device is also provided in present embodiment, as shown in FIG. 25, FIG. 25 is a third structural schematic diagram of the electronic device provided by some embodiments of the present disclosure. The electronic device 10 includes a load 40 and a circuit structure. The circuit structure is connected to the load 40 and supplies the power to the load 40. The structure of the circuit structure can adopt the structure of the circuit structure in any of the above embodiments, and will not be repeated here.

The load 40 is the electromagnetic device such as the electro-acoustic device or the antenna. When the electromagnetic inductor 240 is disposed at the first position 320 in the first induced magnetic field 230 of the battery 220, the electromagnetic device is disposed at the second position 340 in the first induced magnetic field 230, so that the magnetic field intensity at the second position 340 in the first induced magnetic field 230 is weakened after the second induced magnetic field 250 is superimposed on the first induced magnetic field 230.

It should be noted that, relative positions of the battery cell 226 and the electromagnetic inductor 240 in the figure are only schematic diagrams, and the relative positions between the battery cell 226 and the electromagnetic inductor 240 can be adjusted as required. For example, the battery cell and the electromagnetic inductor are separated by a certain distance, or the battery cell and the electromagnetic inductor are arranged adjacently, or the electromagnetic inductor is located between the battery cell and the load, or the electromagnetic inductor is disposed on the side of the battery cell away from the load.

The coil in present embodiment can include a plurality of connection points. The plurality of connection points is used to connect to the positive electrode or the negative electrode of the battery cell, or the plurality of connection points is connected to the load, and each connection point can be controlled by the switch to realize the connection or the disconnection between the connection point and the positive electrode or the negative electrode of the battery cell, or the connection or the disconnection between the connection point and the load, and the magnitude of the second induced magnetic field generated by connecting the different connection points to the positive electrode or the negative electrode of the battery cell is different. A specific structure of the battery may refer to the structures of the above-mentioned embodiments, which will not be repeated here.

It should be appreciated that, in addition to earphones, speakers and other devices, the electronic device in present embodiment can also be a mobile phone, a tablet computer, an audio player, a video player, an augmented reality (AR) device, a virtual reality (VR) devices and other devices.

Figure 26:
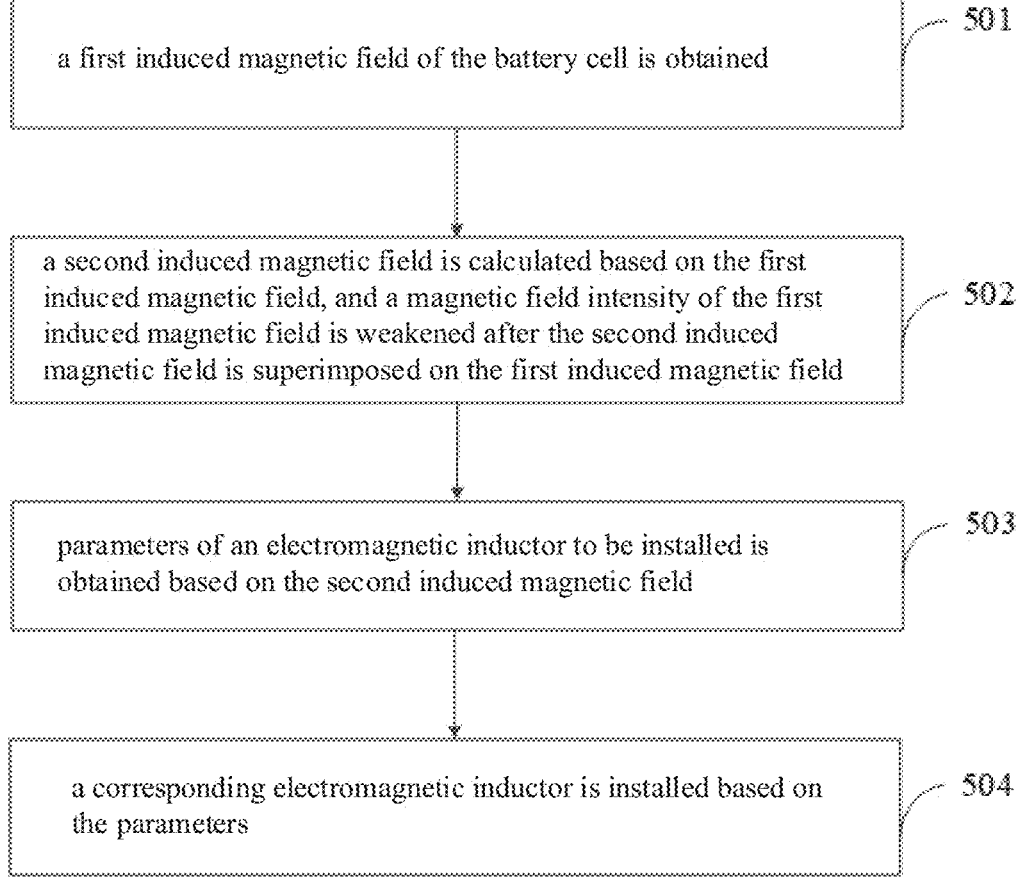
FIG. 26 is a schematic flow chart of a battery manufacturing method provided by some embodiments of the present disclosure.

A battery manufacturing method is also provided in one embodiment of the present disclosure. As shown in FIG. 26, FIG. 26 is a schematic flowchart of the battery manufacturing method provided in some embodiments of the present disclosure. The battery includes a battery cells. The battery manufacturing method may include the following operations.

Operation 501, a first induced magnetic field of the battery cell is obtained.

Operation 502, a second induced magnetic field is calculated based on the first induced magnetic field, and a magnetic field intensity of the first induced magnetic field is weakened after the second induced magnetic field is superimposed on the first induced magnetic field.

Operation 503, parameters of an electromagnetic inductor to be installed is obtained based on the second induced magnetic field.

Operation 503, a corresponding electromagnetic inductor is installed based on the parameters.

The first induced magnetic field of the battery cell can be obtained first, and then the second induced magnetic field can be calculated based on the first induced magnetic field. A purpose of the second induced magnetic field is to weaken the magnetic field intensity of the first induced magnetic field after being superimposed on the first induced magnetic field. After the second induced magnetic field is calculated, the parameters of the electromagnetic inductor that generates the second induced magnetic field can be calculated, such as a material, a size, a distance from the battery cell, etc. of the second induced magnetic field, and then an appropriate electromagnetic inductor can be selected and installed based on the parameters.

When the second induced magnetic field is the coil, the parameters of the electromagnetic inductor that generates the second induced magnetic field also includes a number of turns of the coil, a diameter of the coil, a thickness of the coil, or the like.

It should be appreciated that, before installing the electromagnetic inductor, a preset position that needs to weaken the magnetic field intensity of the first induced magnetic field can be obtained in advance, and the preset position can be used to install the electromagnetic sensitive devices such as the electro-acoustic device, the antennas, etc., and then the second induced magnetic field is calculated based on the preset position of the first induced magnetic field.

It should be appreciated that, the battery manufacturing method in present embodiment can be used to produce the battery assembly or the battery in any of the above embodiments. The battery manufacturing method in present embodiment may further include other operations to manufacture the battery assembly or the battery in any one of the above embodiments, which will not be repeated here. For example, the coil can be connected to the positive electrode or the negative electrode of the battery, or the current detector can be provided, or the battery and the coil can be packaged in the same case, or the plurality of connection points can be disposed on the coil, or the like.

The circuit structure, the battery, the electronic device, and the battery manufacturing method provided in the embodiments of the present disclosure are described above in detail. In the present disclosure, specific examples are used to illustrate the principles and implementation methods of the present disclosure, and the descriptions of the above embodiments are only used to help understand the present disclosure. At the same time, for those skilled in the art, based on the idea of this application, there will be changes in the specific implementation and application scope. In summary, the content of this specification should not be construed as limiting the application.

What is claimed is:

1. A circuit structure, comprising:
   a battery, wherein the battery comprises a first positive electrode, a first negative electrode and a battery cell, the battery cell is connected between the first positive electrode and the first negative electrode, and the battery cell is configured to generate a first induced magnetic field when a changing current flows therethrough; and
   an electromagnetic inductor, wherein the electromagnetic inductor is configured to generate a second induced magnetic field when the changing current flows therethrough, and the second induced magnetic field is superimposed on the first induced magnetic field;

wherein the circuit structure further comprises a current detector, and the current detector is connected to the electromagnetic inductor; the current detector is configured to detect a first current in the battery cell, and adjust a second current in the electromagnetic inductor based on the first current, the battery cell is configured to generate the first induced magnetic field based on the first current, and the electromagnetic inductor is configured to generate the second induced magnetic field based on the second current.

2. The circuit structure as claimed in claim 1, wherein a magnetic field intensity of the first induced magnetic field is weakened after the second induced magnetic field is superimposed on the first induced magnetic field.

3. The circuit structure as claimed in claim 1, wherein the electromagnetic inductor is disposed at a first position in the first induced magnetic field, and a magnetic field intensity at a second position in the first induced magnetic field is weakened after the second induced magnetic field is superimposed on the first induced magnetic field.

4. The circuit structure as claimed in claim 1, wherein the electromagnetic inductor is a coil, and the coil is connected to the first positive electrode or the first negative electrode.

5. The circuit structure as claimed in claim 4, wherein the coil is formed by a first trace, and the first trace is formed by etching on a circuit board.

6. The circuit structure as claimed in claim 1, wherein a direction of the first current is opposite to that of the second current, so that the second induced magnetic field and the first induced magnetic field cancel each other, so as to weaken a magnetic field intensity of the first induced magnetic field.

7. A battery, comprising:

a first positive electrode;

a first negative electrode;

a battery cell, wherein the battery cell is connected between the first positive electrode and the first negative electrode, and the battery cell is configured to generate a first induced magnetic field when a changing current flows therethrough;

an electromagnetic inductor, wherein the electromagnetic inductor is configured to generate a second induced magnetic field when the changing current flows therethrough, and the second induced magnetic field is superimposed on the first induced magnetic field; and a current detector connected to the electromagnetic inductor; wherein the current detector is configured to detect a first current in the battery cell, and adjust a second current in the electromagnetic inductor based on the first current, the battery cell is configured to generate the first induced magnetic field based on the first current, and the electromagnetic inductor is configured to generate the second induced magnetic field based on the second current.

8. The battery as claimed in claim 7, wherein the battery further comprises a casing, and the battery cell and the electromagnetic inductor are packaged in the casing.

9. The battery as claimed in claim 8, wherein the battery cell comprises a second positive electrode and a second negative electrode, the electromagnetic inductor is a coil, a first end of the coil is connected to the second positive electrode, and a second end of the coil is connected to the first positive electrode; or, the first end of the coil connected to the second negative electrode, and the second end of the coil is connected to the first negative electrode.

10. The battery as claimed in claim 9, wherein the battery cell is a winding battery cell, and the coil is disposed at one end of the battery cell and is parallel to an end surface of the battery cell.

11. The battery as claimed in claim 10, wherein the battery further comprises an insulating layer, and the insulating layer is disposed between the battery cell and the coil.

12. The battery as claimed in claim 7, wherein the battery further comprises a protection element, the electromagnetic inductor is disposed in the protection element, and the protection element is adjacent to the battery cell.

13. The battery as claimed in claim 7, wherein a magnetic field intensity of the first induced magnetic field is weakened after the second induced magnetic field is superimposed on the first induced magnetic field.

14. The battery as claimed in claim 7, wherein the electromagnetic inductor is disposed at a first position in a first induction magnetic field, and a magnetic field intensity at a second position in the first induced magnetic field is weakened after the second induction magnetic field is superimposed on the first induction magnetic field.

15. The battery as claimed in claim 7, wherein the battery further comprises a circuit board, and the electromagnetic inductor is disposed on the circuit board.

16. The battery as claimed in claim 15, wherein the circuit board has a first trace formed by etching, and the first trace forms the electromagnetic inductor.

17. The battery as claimed in claim 15, wherein the circuit board is stacked on a surface of the battery cell.

18. An electronic device, comprising:

a load; and a circuit structure or a battery, wherein the circuit structure or the battery is connected to the load and supplies a power to the load, the circuit structure or the battery comprises a first positive electrode, a first negative electrode, a battery cell and an electromagnetic inductor; the battery cell is connected between the first positive electrode and the first negative electrode, the battery cell is configured to generate a first induced magnetic field when a changing current flows therethrough, the electromagnetic inductor is configured to generate a second induced magnetic field when the changing current flows therethrough, and the second induced magnetic field is superimposed on the first induced magnetic field;

wherein the circuit structure further comprises a current detector, and the current detector is connected to the electromagnetic inductor; the current detector is configured to detect a first current in the battery cell, and adjust a second current in the electromagnetic inductor based on the first current, the battery cell is configured to generate the first induced magnetic field based on the first current, and the electromagnetic inductor is configured to generate the second induced magnetic field based on the second current.

19. The electronic device as claimed in claim 18, wherein the load is an electromagnetic device, and when the electromagnetic inductor is disposed at a first position in the first induced magnetic field, the electromagnetic device is disposed at a second position in the first induced magnetic field, a magnetic field intensity at the second position in the first induced magnetic field is weakened after the second induced magnetic field is superimposed on the first induced magnetic field.

20. The electronic device as claimed in claim 18, wherein the electromagnetic inductor is a coil, the coil comprises a plurality of connection points, the plurality of connection points is connected to the positive electrode or the negative electrode, or the plurality of connection points is connected to the load.

* * * * *